(12) United States Patent
Liu

(10) Patent No.: US 12,334,915 B2
(45) Date of Patent: Jun. 17, 2025

(54) HIGH SIDE CURRENT DETECTION CIRCUIT, OVERCURRENT PROTECTION CIRCUIT, CALIBRATION METHOD AND ELECTRONIC DEVICES

(71) Applicant: Halo Microelectronics Co., Ltd, Foshan (CN)

(72) Inventor: Dongming Liu, Foshan (CN)

(73) Assignee: Halo Microelectronics Co., Ltd., Foshan (CN)

( * ) Notice: Subject to any disclaimer, the term of this patent is extended or adjusted under 35 U.S.C. 154(b) by 100 days.

(21) Appl. No.: 18/372,608

(22) Filed: Sep. 25, 2023

(65) Prior Publication Data
US 2024/0213976 A1 Jun. 27, 2024

(30) Foreign Application Priority Data
Dec. 27, 2022 (CN) .......................... 202211681541.6

(51) Int. Cl.
*G05F 1/573* (2006.01)
*H03K 17/081* (2006.01)
*H03K 17/082* (2006.01)
*H03K 17/687* (2006.01)

(52) U.S. Cl.
CPC ......... *H03K 17/0822* (2013.01); *G05F 1/573* (2013.01); *H03K 17/08104* (2013.01); *H03K 17/687* (2013.01); *H03K 2217/0027* (2013.01); *H03K 2217/0063* (2013.01)

(58) Field of Classification Search
CPC .............. G05F 1/573; H03K 17/08104; H03K 17/0822; H03K 17/687; H03K 2217/0027; H03K 2217/0063

USPC .......................................................... 361/93.1
See application file for complete search history.

(56) References Cited

U.S. PATENT DOCUMENTS

| | | | | |
|---|---|---|---|---|
| 5,159,516 | A * | 10/1992 | Fujihira | G01R 19/16552 361/18 |
| 7,573,689 | B2 * | 8/2009 | Hojo | G05F 1/573 361/93.1 |
| 11,115,018 | B1 * | 9/2021 | Ying | H02H 3/087 |
| 2007/0171590 | A1 * | 7/2007 | Nagata | H03K 17/18 361/93.1 |
| 2008/0284403 | A1 * | 11/2008 | Miranda | G05F 5/00 323/303 |
| 2023/0393599 | A1 * | 12/2023 | Yasusaka | G05F 1/573 |
| 2024/0170943 | A1 * | 5/2024 | Li | H02H 5/04 |

* cited by examiner

*Primary Examiner* — William Hernandez
(74) *Attorney, Agent, or Firm* — AP3 Law Firm PLLC

(57) ABSTRACT

A calibration method includes obtaining an offset error of the overcurrent protection circuit by changing a current limiting state of the overcurrent protection circuit, adjusting an offset compensation circuit to calibrate the offset error of the overcurrent protection circuit and adjusting a gain calibration circuit based on the current limiting state of the overcurrent protection circuit to calibrate a gain error of the overcurrent protection circuit, wherein the overcurrent protection circuit comprises a first transistor, a second transistor, a third transistor, a first operational amplifier, a gain calibration circuit, an offset compensation circuit, and a driving circuit, and wherein the driving circuit is configured to receive a signal generated by the gain calibration circuit and generate a gate drive signal applied the first transistor and the third transistor.

20 Claims, 16 Drawing Sheets

HIGH SIDE CURRENT DETECTION CIRCUIT, OVERCURRENT PROTECTION CIRCUIT, CALIBRATION METHOD AND ELECTRONIC DEVICES

RELATED APPLICATION

This application claims the benefit of and priority to Chinese Patent Application No. 2022116815416, filed on Dec. 27, 2022, which is hereby incorporated by reference in its entirety.

TECHNICAL FIELD

The present application relates to the technical field of detection circuits, in particular, to a high-side current detection circuit, an overcurrent protection circuit, a calibration method and electronic devices.

BACKGROUND

Existing electronic devices generally use high-side current detection circuits to detect load currents, and the high-side current detection circuits can also be used in power management modules, over-current protection circuits and other circuits.

As shown in FIG. 1, the output (Out) terminal of the existing high-side current detection circuit is used to output the comparative relationship between the input voltages at the non-inverting input terminal and the inverting input terminal of the operational amplifier OP2. The input voltage at the non-inverting input terminal is a threshold voltage. The voltage input at the inverting input terminal is determined based on the current flowing through the load. Therefore, the comparison relationship output at the output (Out) terminal can convert the amplitude of the current flowing through the load into a detection result.

This circuit often has detection errors in the detection results due to the mismatch between the transistor Q1 and transistor Q2, the process error of the resistor R0, and the input offset of the operational amplifier OP1. The existing high-side current detection circuit usually compensates and calibrates the detection errors by adjusting the resistance of R0. However, the detection error includes error data that changes with the change of the load current and error data that does not change with the change of the load current, resulting in new detection errors when the load current changes. The existing technology can only calibrate the detection error for a single load.

For the above problems, there are no effective technical solutions at present.

SUMMARY

The purpose of this application is to provide a high-side current detection circuit, an overcurrent protection circuit, a calibration method, and electronic devices to accurately calibrate the current detection error of the high-side current detection circuit, so that the high-side current detection circuit can be used for accurate current sensing under different operating conditions.

In a first aspect, the present application provides a high-side current detection circuit for detecting a load current. The high-side current detection circuit includes a first transistor, a second transistor, a third transistor, a first operational amplifier, a gain calibration circuit, an offset compensation circuit, and a detection terminal.

The first terminal of the first transistor is connected to the first terminal of the third transistor and the power supply voltage. The second terminal of the first transistor is connected to the input terminal of the load, and the output terminal of the load is connected to the first terminal of the gain calibration circuit. The second terminal of the third transistor is connected to the first terminal of the second transistor. The third terminal of the first transistor is connected to the third terminal of the third transistor. The second terminal and the third terminal of the second transistor are connected to the second terminal of the gain calibration circuit and the output terminal of the first operational amplifier respectively.

The non-inverting input terminal and the inverting input terminal of the first operational amplifier are connected to the second terminal of the first transistor and the second terminal of the third transistor through a first compensation resistor and a second compensation resistor respectively. The output terminal of the gain calibration circuit is the detection terminal.

The offset compensation circuit is connected to the non-inverting input terminal of the first operational amplifier and/or the inverting input terminal of the first operational amplifier to adjusting the voltage drop across the first compensation resistor and/or the second compensation resistor to compensate for the input offset voltage of the first operational amplifier.

The high-side current detection circuit of the present application compensates for the input offset voltage of the first operational amplifier by connecting the first compensation resistor, the second compensation resistor and the offset compensation circuit to the input side of the first operational amplifier, thereby calibrating the offset error of the entire circuit. The circuit also includes a gain calibration circuit to calibrate the gain error, thereby separating the detection error of the high-side current sensing circuit into a fixed offset error and a dynamic gain error that varies with the load current. This calibration effectively eliminates the detection error of the high-side current sensing circuit under different load currents.

The offset compensation circuit of the high-side current detection circuit includes a first current source and a second current source. The first terminal of the first current source is connected to the non-inverting input terminal of the first operational amplifier. The first terminal of the second current source is connected to the inverting input terminal of the first operational amplifier. The second terminals of the first current source and the second current source, and the output of the load are grounded.

The high-side current detection circuit of this example can compensate for the input offset voltage of the first operational amplifier by changing the current magnitudes of the first current source and the second current source to cause the first compensation resistor and the second compensation resistor to produce different voltage drops. Additionally, if the polarity of the input offset voltage of the first operational amplifier is known, the first current source or the second current source can be individually activated to compensate for the input offset voltage.

The offset compensation circuit of the high-side current detection circuit includes a third current source and a switch. The first terminal of the third current source is selectively connected to the non-inverting input terminal or the inverting input terminal of the first operational amplifier through the switch. The second terminal of the third current source and the output terminal of the load are all grounded.

The high-side current detection circuit of this example fixes the connection mode of the third current source by switching the switch under the condition that the polarity of the input offset voltage of the first operational amplifier is known, and independently adjusts the voltage drop of the first compensation resistor or the second compensation resistor to compensate for the input offset voltage.

In some embodiments of the present disclosure, the high-side current sensing circuit further includes a compensation circuit comprising a fourth current source and a fifth current source. The second terminal of the fourth current source and the first terminal of the fifth current source are both connected to either the inverting input or the non-inverting input of the first operational amplifier. The second terminal of the fifth current source and the output terminal of the load are both grounded. The first terminal of the fourth current source is connected to a voltage source.

In this example of the high-side current sensing circuit, with a known polarity of the input offset voltage of the first operational amplifier, the fourth current source or the fifth current source is selectively enabled to provide a source current or a sink current to adjust the voltage drop across the corresponding compensation resistor for offset compensation.

In the high-side current sensing circuit, the first transistor and the third transistor are NMOS transistors, while the second transistor is a PMOS transistor.

In some embodiments of the present disclosure, the high-side current sensing circuit also includes a gain calibration circuit comprising a sampling resistor, a second operational amplifier, and a threshold voltage circuit. The first terminal of the sampling resistor is connected to the first terminal of the gain calibration circuit, and the second terminal of the sampling resistor is connected to the second terminal of the gain calibration circuit. The non-inverting input and the inverting input of the second operational amplifier are connected to the output terminal of the threshold voltage circuit and the second terminal of the sampling resistor respectively. The output terminal of the second operational amplifier serves as the detection terminal.

In some embodiments of the present disclosure, the high-side current sensing circuit includes a threshold voltage circuit comprising an analog-to-digital converter. The output terminal of the analog-to-digital converter is the output terminal of the threshold voltage circuit.

In some embodiments of the present disclosure, the high-side current sensing circuit further includes a threshold voltage circuit comprising a sixth current source and a threshold resistor. The first terminal of the threshold resistor is connected to the second terminal of the sixth current source and the non-inverting input of the second operational amplifier. The second terminal of the threshold resistor is grounded. The first terminal of the sixth current source is connected to a voltage source.

In some embodiments of the present disclosure, the high-side current sensing circuit includes a gain calibration circuit comprising a current mirror circuit and a seventh current source. The current mirror circuit has a current input terminal, a current output terminal, and a detection terminal. The current input terminal is the second terminal of the gain calibration circuit. The current output terminal is the first terminal of the gain calibration circuit. The detection terminal is connected to the second terminal of the seventh current source. The first terminal of the seventh current source is connected to a voltage source.

The voltage source in the high-side current sensing circuit can be an independent voltage source or the supply voltage.

The current mirror circuit of the high-side current sensing circuit includes a fourth transistor and a fifth transistor. The first terminal of the fourth transistor is the current input terminal. The second terminal of the fourth transistor and the second terminal of the fifth transistor are both the current output terminal. The first terminal of the fifth transistor is the detection terminal, and the third terminal of the fourth transistor is connected to the third terminal of the fifth transistor and the first terminal of the fourth transistor.

Both the fourth transistor and the fifth transistor in the high-side current sensing circuit are NMOS transistors.

The current sources in the compensation circuit and the gain calibration circuit of the high-side current sensing circuit are adjustable current sources.

In a second aspect, this application also provides an overcurrent protection circuit for preventing overcurrent of the load. The overcurrent protection circuit comprises a first transistor, a second transistor, a third transistor, a first operational amplifier, a gain calibration circuit, a compensation circuit, and a drive circuit.

The first terminal of the first transistor is connected to the first terminal of the third transistor and the supply voltage. The second terminal of the first transistor is connected to the input terminal of the load. The output terminal of the load is connected to the first terminal of the gain calibration circuit. The second terminal of the third transistor is connected to the first terminal of the second transistor. The third terminal of the first transistor is connected to the third terminal of the third transistor and the second terminal of the drive circuit. The second terminal and third terminal of the second transistor are connected to the second terminal of the gain calibration circuit and the output terminal of the first operational amplifier respectively. The non-inverting input and the inverting input of the first operational amplifier are connected to the second terminal of the first transistor and the second terminal of the third transistor through the first compensation resistor and the second compensation resistor, respectively.

The compensation circuit is connected to the non-inverting input and/or the inverting input of the first operational amplifier to adjust the voltage drop across the first compensation resistor and/or the second compensation resistor to compensate for the input offset voltage of the first operational amplifier. The first terminal of the drive circuit is connected to the output terminal of the gain calibration circuit. The drive circuit controls the conduction resistance of the first transistor based on the output of the gain calibration circuit to limit the conduction current of the first transistor to a preset value when the load current exceeds a current limit.

The overcurrent protection circuit of this application compensates for the input offset voltage of the first operational amplifier by connecting the first compensation resistor, the second compensation resistor, and the offset compensation circuit to the input side of the first operational amplifier. This calibration compensates for the offset error of the entire circuit. This is combined with the gain calibration circuit to calibrate gain error, thereby effectively eliminating the detection error of the overcurrent protection circuit under different load currents, enabling the overcurrent protection circuit to accurately determine whether the load has an overcurrent condition based on more precise detection results, avoiding problems of false triggering or failure to trigger due to overcurrent protection misjudgments.

In the overcurrent protection circuit, the gain calibration circuit includes a sampling resistor, an error amplification circuit, and a threshold voltage circuit. The first terminal of the sampling resistor is the first terminal of the gain calibration circuit, and the second terminal of the sampling resistor is the second terminal of the gain calibration circuit. The output terminal of the error amplification circuit is the output terminal of the gain calibration circuit. The non-inverting input and the inverting input of the error amplification circuit are connected to the output terminal of the threshold voltage circuit and the second terminal of the sampling resistor respectively. The error amplification circuit generates a control signal based on the voltage information at the second terminal of the sampling resistor and the output voltage of the threshold voltage circuit to adjust the conduction resistance of the first transistor through the drive circuit.

In the overcurrent protection circuit, the gain calibration circuit includes a current mirror circuit and a seventh current source. The current mirror circuit has a current input terminal, a current output terminal, and a detection terminal. The current input terminal is the second terminal of the gain calibration circuit. The current output terminal is the first terminal of the gain calibration circuit. The detection terminal is connected to the second terminal of the seventh current source. The first terminal of the seventh current source is connected to a voltage source. The current mirror circuit outputs a current difference through the detection terminal to enable the drive circuit to adjust the conduction resistance of the first transistor based on the current difference.

In the overcurrent protection circuit, the gain calibration circuit includes an eighth current source. The second terminal of the eighth current source is the first terminal of the gain calibration circuit, and the first terminal of the eighth current source is connected to both the second terminal and the output terminal of the gain calibration circuit. The eighth current source outputs a current difference through the first terminal to enable the drive circuit to adjust the conduction resistance of the first transistor based on the current difference.

In a third aspect, this application also provides a calibration method for calibrating the overcurrent protection circuit provided in the second aspect. The calibration method includes the following steps: obtaining the offset error of the overcurrent protection circuit by changing the current limiting state of the overcurrent protection circuit, adjusting the offset compensation circuit to calibrate the offset error of the overcurrent protection circuit, and adjusting the gain calibration circuit based on the current limiting state of the overcurrent protection circuit to calibrate the gain error of the overcurrent protection circuit.

The calibration method of this application calibrates the offset error quickly based on the current limiting state and then calibrates the gain error, effectively eliminating the detection error of the overcurrent protection circuit under different load currents. This allows the overcurrent protection circuit to determine whether the load has an overcurrent condition based on more accurate detection results, avoiding problems of false triggering or failure to trigger due to overcurrent protection misjudgments.

With respect to the calibration method, the gain calibration circuit comprises a sampling resistor, an error amplification circuit, and a threshold voltage circuit. The first terminal of the sampling resistor is the first terminal of the gain calibration circuit, and the second terminal of the sampling resistor is the second terminal of the gain calibration circuit. The output terminal of the error amplification circuit is the output terminal of the gain calibration circuit. The non-inverting input and the inverting input of the error amplification circuit are connected to the output terminal of the threshold voltage circuit and the second terminal of the sampling resistor respectively. The error amplification circuit generates a control signal based on the voltage information at the second terminal of the sampling resistor and the output voltage of the threshold voltage circuit to adjust the conduction resistance of the first transistor through the drive circuit.

The steps of obtaining the offset error of the overcurrent protection circuit by changing the current limiting state of the overcurrent protection circuit include: obtaining the load current information and the voltage information at the second terminal of the sampling resistor in at least two different predetermined current limiting states of the overcurrent protection circuit with the offset compensation circuit disabled, calculating and obtaining the offset error based on the load current information and the voltage information.

With respect to the calibration method, the steps of calculating and obtaining the offset error based on the load current information and the voltage information include: obtaining a first relationship based on the load current information and the voltage information in different predetermined current limiting states, where the first relationship represents the variation of the voltage information with respect to a change in the load current information, and calculating and obtaining the offset error based on the first relationship, where the offset error is the voltage information when the load current information is zero.

With respect to the calibration method, the steps of adjusting the gain calibration circuit based on the current limiting state of the overcurrent protection circuit to calibrate the gain error of the overcurrent protection circuit include: obtaining the load current information and the target current limit information in a current limiting state, and adjusting the output voltage of the threshold voltage circuit in different current limiting states based on the proportional relationship between the load current information and the target current limit information to calibrate the gain error of the overcurrent protection circuit.

With respect to the calibration method, the gain calibration circuit comprises a current mirror circuit and a seventh current source. The current mirror circuit has a current input terminal, a current output terminal, and a detection terminal. The current input terminal is the second terminal of the gain calibration circuit. The current output terminal is the first terminal of the gain calibration circuit, and the detection terminal is connected to the second terminal of the seventh current source. The first terminal of the seventh current source is connected to a voltage source. The current mirror circuit outputs a current difference through the detection terminal to enable the drive circuit to adjust the conduction resistance of the first transistor based on the current difference.

The steps of obtaining the offset error of the overcurrent protection circuit by changing the current limiting state of the overcurrent protection circuit include: obtaining the load current information and the current information at the second terminal of the seventh current source in at least two different predetermined current limiting states of the overcurrent protection circuit with the offset compensation circuit disabled, and calculating and obtaining the offset error based on the load current information and the current information.

With respect to the calibration method, the steps of adjusting the gain calibration circuit based on the current limiting state of the overcurrent protection circuit to calibrate the gain error of the overcurrent protection circuit include: obtaining the load current information and the target current limit information in a current limiting state, and adjusting the output current of the seventh current source in different current limiting states based on the proportional relationship between the load current information and the target current limit information or adjusting the current mirror ratio of the current mirror circuit to calibrate the gain error of the overcurrent protection circuit.

The gain calibration circuit comprises an eighth current source. The second terminal of the eighth current source is the first terminal of the gain calibration circuit, and the first terminal of the eighth current source is connected to the second terminal and the output terminal of the gain calibration circuit. The eighth current source outputs a current difference through the first terminal to enable the drive circuit to adjust the conduction resistance of the first transistor based on the current difference.

The steps of obtaining the offset error of the overcurrent protection circuit by changing the current limiting state of the circuit include: with the offset compensation circuit disabled, obtaining the load current information and the current information at the first terminal of the eighth current source in at least two different predetermined current limiting states of the overcurrent protection circuit, and calculating and obtaining the offset error based on the load current information and the current information.

With respect to the calibration method, the steps for adjusting the gain calibration circuit based on the current limiting state of the overcurrent protection circuit to calibrate the gain error include: obtaining the load current information and the target current limit information in a current limiting state, and adjusting the output current of the eighth current source in different current limiting states based on the proportional relationship between the load current information and the target current limit information to calibrate the gain error of the overcurrent protection circuit.

With respect to the calibration method, the steps for calculating and obtaining the offset error based on the load current information and the current information include: obtaining a second relationship based on the load current information and the current information in different predetermined current limiting states, where the second relationship represents the variation relationship of the current information with respect to the changing load current information, and calculating and obtaining the offset error based on the second relationship, where the offset error is the current information when the load current information is zero.

With respect to the calibration method, the steps for adjusting the offset compensation circuit to calibrate the offset error of the overcurrent protection circuit include: adjusting the offset compensation circuit to change the voltage drop across the first compensation resistor and/or the second compensation resistor until the offset error is less than or equal to a predetermined threshold, thereby completing the calibration of the offset error of the overcurrent protection circuit.

With respect to the calibration method, the steps for adjusting the offset compensation circuit to change the voltage drop across the first compensation resistor and/or the second compensation resistor include: when the offset error is positive, iteratively adjust the offset compensation circuit to increase the current at the non-inverting input terminal of the first operational amplifier, gradually increasing the voltage drop across the first compensation resistor. When the offset error is negative, iteratively adjust the offset compensation circuit to increase the current at the inverting input terminal of the first operational amplifier, gradually increasing the voltage drop across the second compensation resistor.

In the fourth aspect, the present application also provides an electronic device. The electronic device includes the high-side current sensing circuit provided in the first aspect or the overcurrent protection circuit provided in the second aspect.

In summary, the present application provides a high-side current sensing circuit, an overcurrent protection circuit, a calibration method, and an electronic device. The overcurrent protection circuit comprises the high-side current sensing circuit. Both the overcurrent protection circuit and the high-side current sensing circuit compensate for the input offset voltage of the first operational amplifier by connecting the first compensation resistor, the second compensation resistor, and the offset compensation circuit to the input side of the first operational amplifier, thereby calibrating the offset error of the entire circuit. Additionally, the gain calibration circuit calibrates the gain error. This allows the detection error of the overcurrent protection circuit and the high-side current sensing circuit to be divided into a fixed offset error and a dynamic gain error that varies with the load current and be calibrated separately, effectively eliminating the detection error of the high-side current sensing circuit under different load currents. The overcurrent protection circuit can provide accurate overcurrent protection based on the different operating states of the load.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Figure 1:
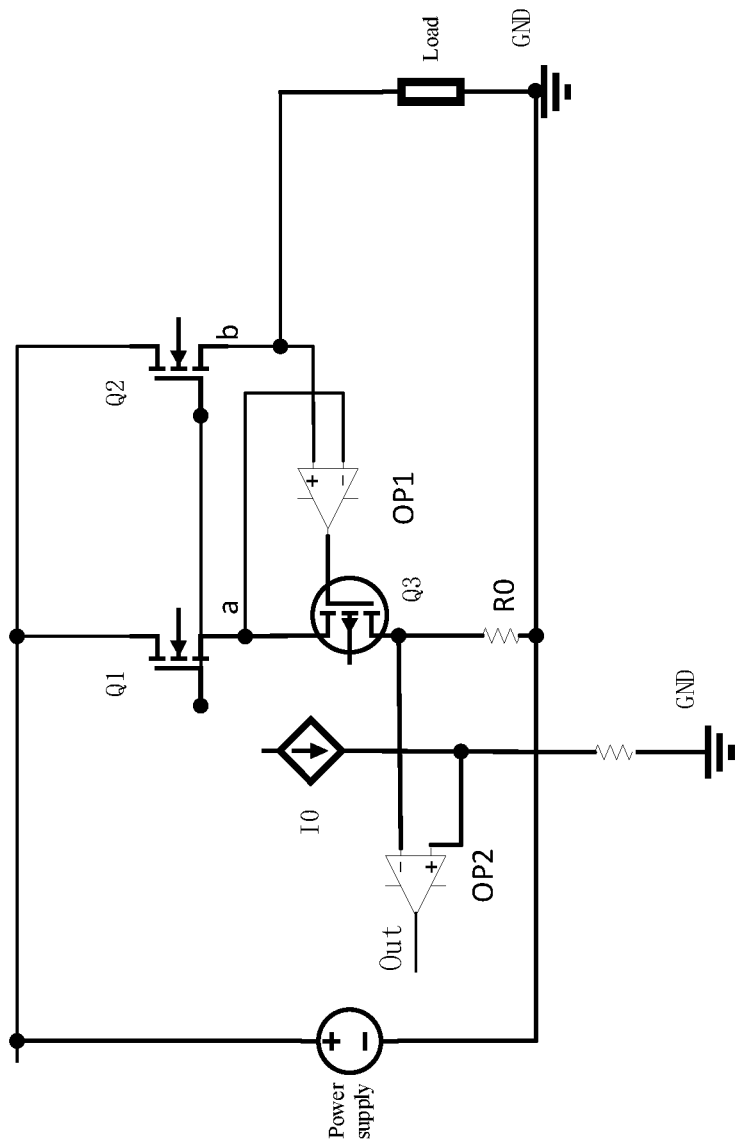
FIG. 1 is a schematic of a high-side current detection circuit in the prior art.
Figure 2:
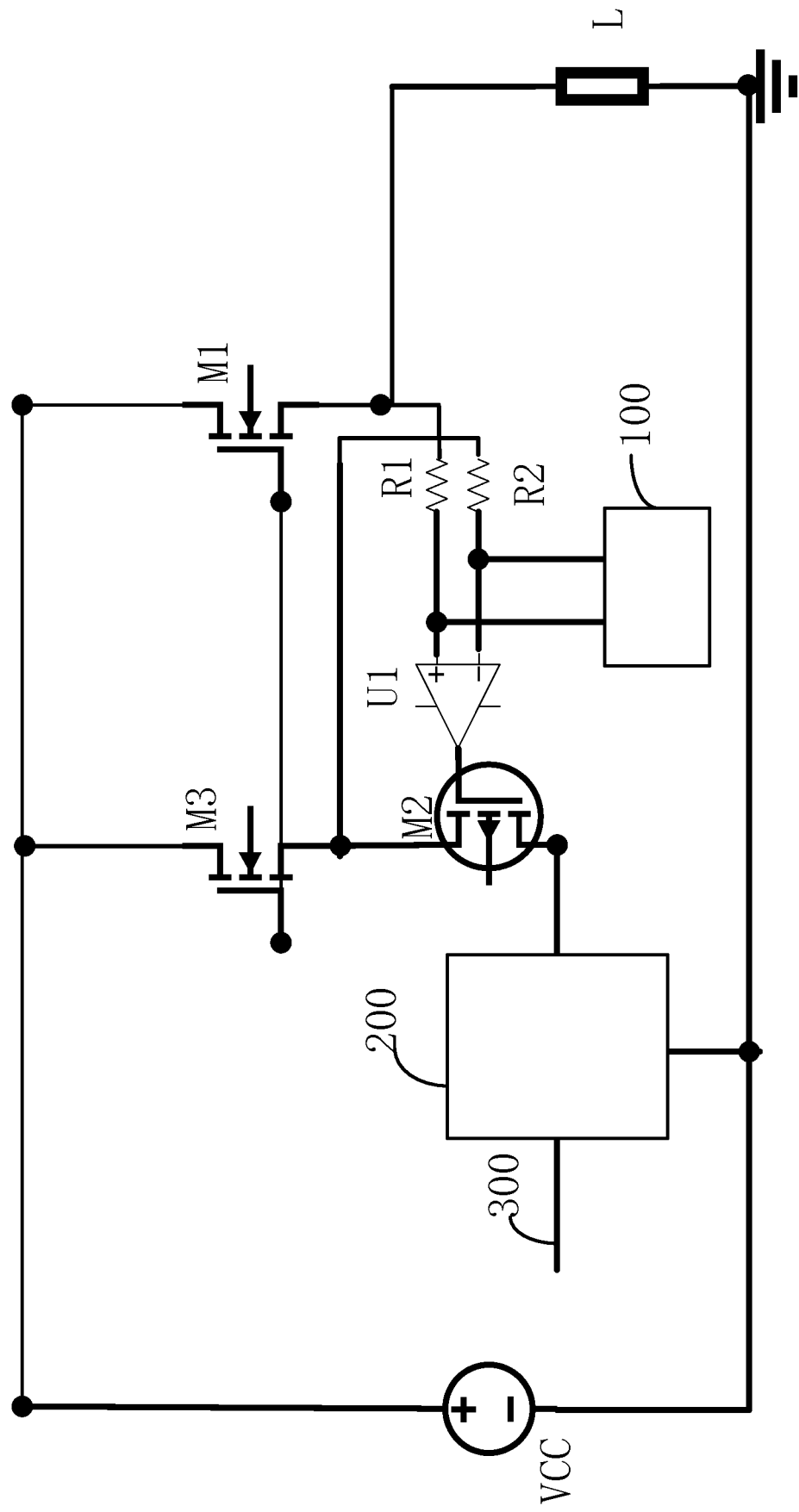
FIG. 2 is a schematic of a high-side current detection circuit provided by some embodiments of the present application.

Reference signs: 100, offset compensation circuit; 200, gain calibration circuit; 300, detection terminal; 400, drive circuit; M1, first transistor; M2, second transistor; M3, third transistor; M4, fourth transistor; M5, the fifth transistor; I1, the first current source; I2, the second current source; I3, the third current source; I4, the fourth current source; I5, the fifth current source; I6, the sixth current source; I7, the seventh current source; U1, first operational amplifier; U2, second operational amplifier; U3, digital-to-analog converter; U4, error amplifier circuit; R1, first compensation resistor; R2, second compensation resistor; R3, sampling resistor; R4, threshold resistance; SW1, switch; L, load; C1, capacitor.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Below, with reference to the drawings in the embodiments of the present application, the technical solutions in the embodiments of the present application will be described clearly and completely. It is apparent that the described embodiments are only a part of the embodiments of the present application, not all of them. Typically, components described and shown in the accompanying drawings can be arranged and designed in various configurations. Therefore, the following detailed description of the embodiments of the present application provided in the drawings is not intended to limit the scope of the claimed subject matter of the present application but merely represents selected embodiments of the present application. Based on the embodiments of the present application, all other embodiments obtained by those skilled in the art without exercising inventive labor fall within the scope of protection of the present application.

It should be noted that similar reference numerals and letters in the following drawings represent similar items, so once an item is defined in one drawing, it does not need to be further defined and explained in subsequent drawings. At the same time, in the description of the present application, the terms "first," "second," etc., are used only to distinguish one description from another and should not be construed as indicating or implying relative importance.

As shown in FIG. 1, the existing high-side current sensing circuit utilizes a transistor Q1 as a current sampling transistor. The physical size of Q1 is proportional to the physical size of a transistor Q2 with a ratio of 1:M, where M is generally between 1000 and 100000. Operational amplifier OP1 ensures that the voltage at point a is equal to the voltage at point b. The circuit satisfies the following condition:

$$IR0 = Iload/M$$

IR0 is the current flowing through resistor R0. Therefore, the amplitude of the load current Iload can be detected based on the voltage at the inverting input of the operational amplifier OP2, or the relationship between the load current Iload and the target current value can be determined based on the output voltage at the Out terminal, where the target current value is represented by the voltage at the non-inverting input of the operational amplifier OP2.

During actual operation, the process deviation of resistor R0 (i.e., the resistance value is not equal to the design value), the mismatch between transistor Q1 and transistor Q2 (the ratio of physical sizes is not the set value of 1:M), and the input offset of operational amplifier OP1 (the input offset voltage) can all lead to inaccurate detection of the load current, requiring calibration of the detection error.

Taking the circuit in FIG. 1 as an example, assuming that the ON resistance of transistor Q1 and transistor Q2 is Rq1 and Rq2, respectively, the voltage at point b connected to the load is:

$$Vb = Vin - Iload \times Rq2$$

Vin is the input voltage from the power supply. Point b is connected to the non-inverting input (+) of operational amplifier OP1. Assuming that the input offset voltage between its voltage and the voltage at point a connected to the inverting input (−) of operational amplifier OP1 is Vos, then when the closed-loop operation of the circuit for load overcurrent protection reaches a steady state, the voltage at point a is:

$$Va = Vin - Iload \times Rq2 - Vos$$

It should be noted that assuming that operational amplifier OP1 is close to ideal and has almost no input current, meaning the current flowing through transistor Q2 is the same as the current flowing into the load. In this case, the voltage difference between the source and drain of transistor Q1 is:

$$Vds1 = Iload \times Rq2 + Vos$$

As a result, the current flowing through resistor R0 is equal to the current flowing through transistor Q1. This is given by the following equation:

$$Iq1 = (Iload \times Rq2 + Vos)/Rq1$$

Consequently, the voltage at the common node of transistor Q3 and resistor R0 (i.e., the inverting input (−) of operational amplifier OP2) is:

$$Vs = (Iload \times Rq2 + Vos) \times \frac{R0}{Rq1} = Iload \times \frac{Rq2}{Rq1} \times R0 + Vos \times \frac{R0}{Rq1} \quad (1)$$

Based on the above equation, it can be seen that the voltage Vs includes two parts. The first part varies linearly with the output load current, and it can be considered as the gain G, which is equal to (Rq2/Rq1)×R0. When there is a difference between the voltage at the inverting input (−) of the operational amplifier OP2 (which corresponds to a specific load current Iload), and the voltage at the non-inverting input (+) of the operational amplifier OP2 (which is determined by the target current), there exists a gain error ΔG. Existing technologies often adjust R0 to calibrate the gain error ΔG. The second part of the voltage Vs is a constant that does not change with the variation of the output current Iload. The second part can be considered as the offset error ΔVos. This second part is equal to Vos×R0/Rq1. Existing technologies for high-side current detection circuits can only calibrate the detection error by adjusting R0 (i.e., calibrating both the gain error ΔG and the offset error ΔVos using R0 simultaneously). However, the actual detection error includes components that vary with the current and components that do not vary with the current. After the calibration process is completed, if the load current Iload is changed, it will result in new detection errors for the voltage Vs. Existing technologies for high-side current detection circuits can only calibrate the detection errors corresponding to a single load current.

Firstly, please refer to FIGS. 2 to 6. In some embodiments, this application provides a high-side current detection circuit for detecting the current of load L. The high-side current detection circuit includes a first transistor M1, a second transistor M2, a third transistor M3, a first operational amplifier U1, a gain calibration circuit 200, an offset compensation circuit 100, and a detection terminal 300.

The first terminal of the first transistor M1 is connected to the first terminal of the third transistor M3 and the power supply voltage VCC. The second terminal of the first transistor M1 is connected to the input terminal of load L, and the output terminal of load L is connected to the first terminal of the gain calibration circuit 200. The second terminal of the third transistor M3 is connected to the first terminal of the second transistor M2. The third terminal of the first transistor M1 is connected to the third terminal of the third transistor M3. The second terminal and third terminal of the second transistor M2 are connected to the second terminal of the gain calibration circuit 200 and the output terminal of the first operational amplifier, respectively.

The non-inverting input and the inverting input of the first operational amplifier U1 are connected to the second terminal of the first transistor M1 and the second terminal of the third transistor M3 through the first compensation resistor R1 and the second compensation resistor R2 respectively. The output terminal of the gain calibration circuit 200 is the detection terminal 300.

The offset compensation circuit 100 is connected to the non-inverting input and/or the inverting input of the first operational amplifier U1 to adjust the voltage drop on the first compensation resistor R1 and/or the second compensation resistor R2 to compensate for the input offset voltage of the first operational amplifier U1.

Specifically, in some embodiments, the high-side current detection circuit of this application is based on the second terminal of the gain calibration circuit 200 to collect and obtain a signal representing the current flowing into the load L, and the type and acquisition process of this signal depend on the structure and composition of the gain calibration circuit 200. It can be a voltage signal at the second terminal of the gain calibration circuit 200 or a current signal flowing into the second terminal of the gain calibration circuit 200. Therefore, the input signal at the second terminal of the gain calibration circuit 200 can reflect the amplitude of the load current. The output terminal (i.e., the detection terminal 300) of the gain calibration circuit 200 is used to output a detection signal representing the relationship between the load current and the target current. The target current can be the current value corresponding to a certain rated operating state of the load, or it can be a reference current value set for comparing and calculating the load current. The high-side current detection circuit of this application aims to calibrate the input signal representing the amplitude of the load current at the second terminal of the gain calibration circuit 200 using the compensation structure in the circuit and then calibrate the detection signal representing the relationship between the load current and the target current output by the detection terminal 300, in order to more accurately obtain the operating state of the load L.

More specifically, the high-side current detection circuit of this application separates the detection error of the entire circuit into two parts and compensates and calibrates them separately using the gain calibration circuit 200 and the offset compensation circuit 100. The gain calibration circuit 200 is used to compensate and calibrate the gain error ΔG, which changes with the load current. The offset compensation circuit 100 is used to compensate and calibrate the offset error ΔVos, which is determined by the characteristics of the first operational amplifier U1 and does not change with the load current. Since the offset error is mainly caused by the input offset voltage of the first operational amplifier U1, in some embodiments, the offset error is denoted as ΔVos.

It should be understood that, in order to avoid mutual interference between the calibration processes of the gain error ΔG and the offset error ΔVos, the high-side current detection circuit of this application should calibrate the offset error ΔVos before calibrating the gain error ΔG.

More specifically, the offset compensation circuit 100 is used to compensate for the input offset voltage of the first operational amplifier U1 and calibrate the input signal representing the amplitude of the load current at the second terminal of the gain calibration circuit 200, thereby calibrating the detection signal output by the detection terminal 300. In this embodiment of the high-side current detection circuit, the non-inverting input and the inverting input of the first operational amplifier U1 are connected to the first compensation resistor R1 and the second compensation resistor R2 respectively. The offset compensation circuit 100 is placed between the non-inverting input of the first operational amplifier U1 and the first compensation resistor R1, and/or between the inverting input of the first operational amplifier U1 and the second compensation resistor R2. It adjusts the output based on the actual input offset voltage of the first operational amplifier U1 by creating different voltage drops across the first compensation resistor R1 and the second compensation resistor R2. This ensures that the non-inverting input and the inverting input of the first operational amplifier U1 have a specific voltage difference to compensate for the input offset voltage of the first operational amplifier U1, thus compensating for the offset error ΔVos of the entire high-side current detection circuit. It should be noted that the structure and connection of the offset compensation circuit 100 are related to its functionality. For example, when it is connected only to the non-inverting input or the inverting input of the first operational amplifier U1, it should have the function and corresponding circuit structure to increase the voltage drop across the corresponding compensation resistor and decrease the voltage drop across the corresponding compensation resistor. Similarly, when it is connected to both the non-inverting input and the inverting input of the first operational amplifier U1, it should have the function and corresponding circuit structure to increase or decrease the voltage drop across the corresponding compensation resistor.

Furthermore, due to the connection of the first compensation resistor R1 and the second compensation resistor R2 to the first operational amplifier U1, the offset compensation circuit 100 can conveniently adjust the voltage drops across the first compensation resistor R1 and the second compensation resistor R2 by changing the input current. For example, by sourcing or sinking a specific current value, the offset compensation circuit 100 can generate a specific voltage drop compensation amount across the input terminals of the first operational amplifier U1. Specifically, the gain calibration circuit 200 is used to directly calibrate the input signal representing the amplitude of the load current at its second terminal, and thereby calibrating the detection signal output by the detection terminal 300. The premise of this calibration process is to calibrate the offset error ΔVos before calibrating the gain error ΔG. It should be understood that in this embodiment of the high-side current detection circuit, the offset compensation circuit 100 is provided for compensating for the offset error ΔVos, which enables the gain calibration circuit 200 to calibrate the gain error ΔG after the offset error ΔVos is calibrated.

Specifically, as mentioned above, the gain error ΔG is an error value that varies with the load current, and there is generally a clear proportional relationship between these two. In the calibration process using the gain calibration circuit 200 to calibrate the gain error ΔG, the electrical parameters of the detection terminal 300 are adjusted proportionally based on the proportion of the gain error ΔG within the overall gain. This ensures that in the high-side current detection circuit of this embodiment, the gain calibration circuit 200 can obtain an accurate input signal representing the amplitude of the load current at its second terminal, regardless of different load currents. Consequently, the detection terminal 300 can accurately output the comparison result between the load current and the target current, thus providing an accurate detection signal.

In this embodiment of the high-side current detection circuit, by connecting the first compensation resistor R1, the second compensation resistor R2, and the offset compensation circuit 100 to the input side of the first operational amplifier U1, the input offset voltage of the first operational amplifier U1 is compensated, thus calibrating the offset error ΔVos of the entire circuit. Combining this with the calibration of the gain error ΔG using the gain calibration circuit 200, the high-side current detection circuit effectively eliminates the detection error under different load currents.

Figure 3:
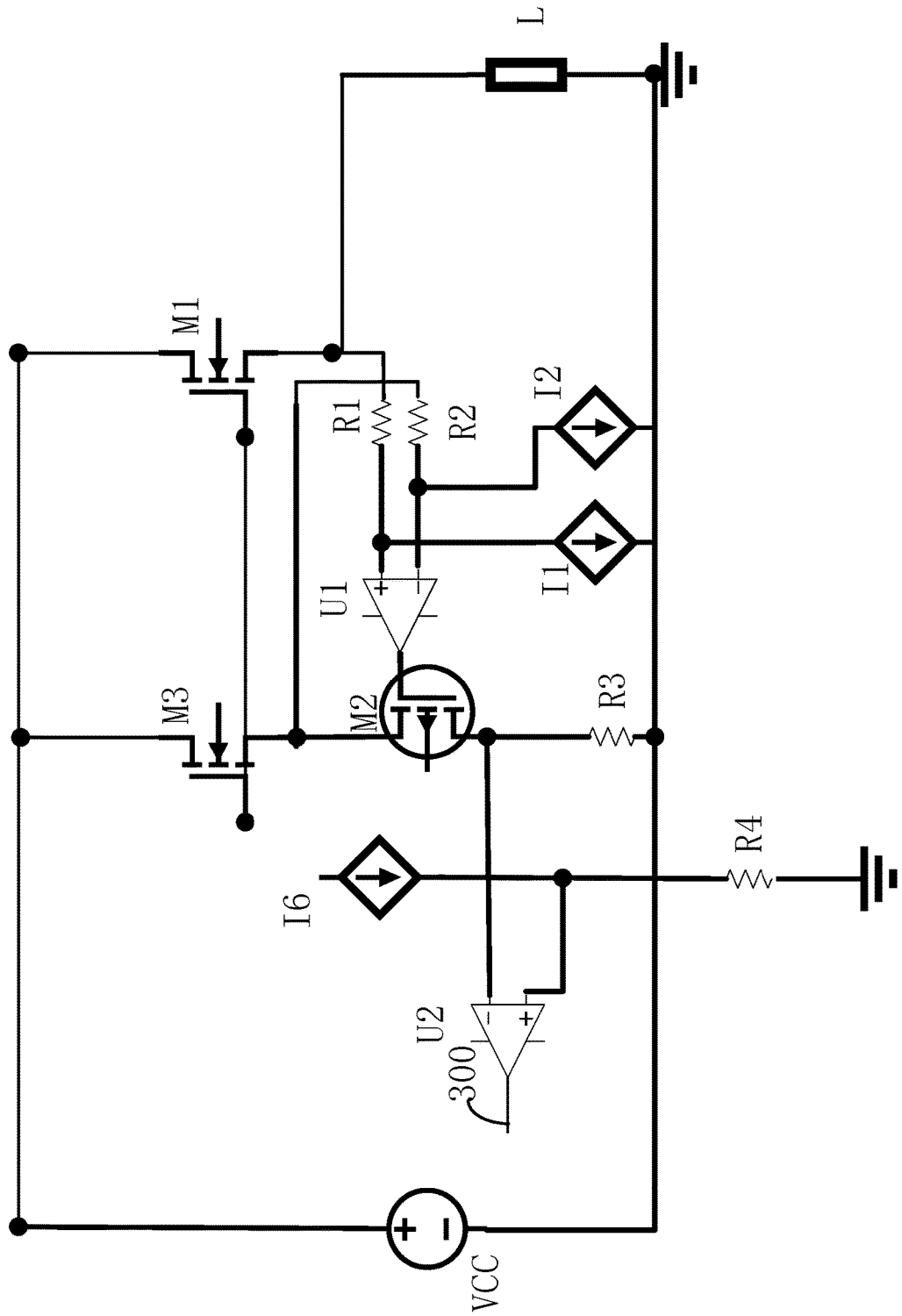
FIG. 3 is a schematic of a high-side current detection circuit provided by some embodiments of the present application.

In some preferred embodiments, as shown in FIG. 3, the offset compensation circuit 100 includes a first current source I1 and a second current source I2. The first terminal of the first current source I1 is connected to the non-inverting input of the first operational amplifier U1, and the first terminal of the second current source I2 is connected to the inverting input of the first operational amplifier U1. The second terminal of the first current source I1, the second terminal of the second current source I2, and the output terminal of the load L are all grounded. Specifically, in this embodiment, the first current source I1 and the second current source I2 have the same current direction and are used to adjust the voltage drops across the first compensation resistor R1 and the second compensation resistor R2, respectively. The first current source I1 and the second current source I2, with the same current direction, can respectively source or sink current to increase or decrease the voltage drops across the first compensation resistor R1 and the second compensation resistor R2. The high-side current detection circuit in this embodiment can adjust the current amplitude of the first current source I1 and the second current source I2 to generate different voltage drops across the first compensation resistor R1 and the second compensation resistor R2 for compensating the input offset voltage of the first operational amplifier U1. Additionally, when the polarity (positive value or negative value) of the input offset voltage of the first operational amplifier U1 is known, the offset compensation circuit can be activated individually by the first current source I1 or the second current source I2 to compensate for the input offset voltage.

Figure 4:
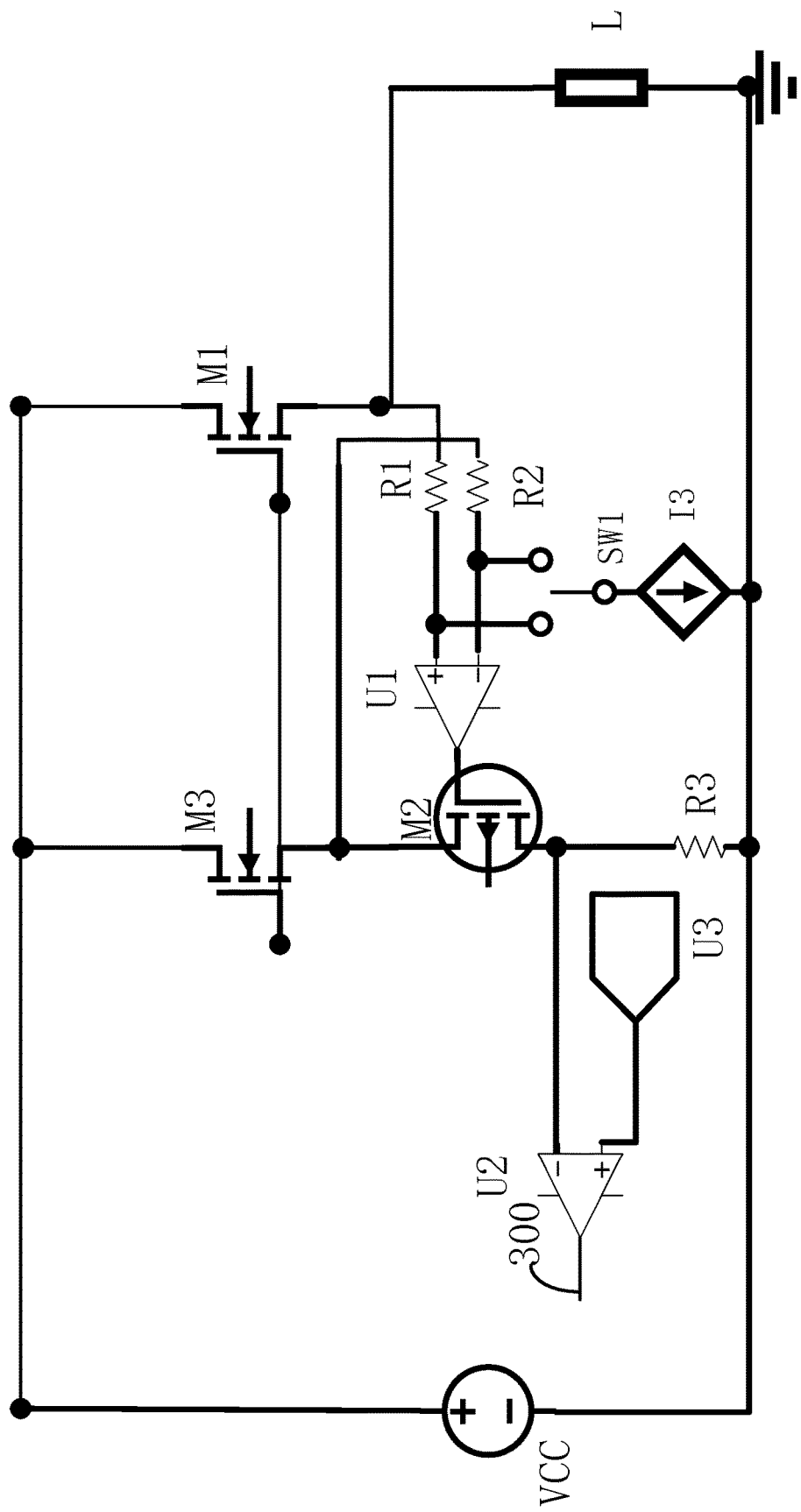
FIG. 4 is a schematic of a high-side current detection circuit provided by some embodiments of the present application.

In some preferred implementation methods, as shown in FIG. 4, the offset compensation circuit 100 includes a third current source I3 and a selection switch SW1. The first terminal of the third current source I3 is connected to the inverting input terminal or the non-inverting input terminal of the first operational amplifier U1 through the selection switch SW1. The second terminal of the third current source I3 and the output terminal of the load L are both grounded.

Specifically, in this implementation method, the third current source I3 can adjust the voltage drop across the corresponding compensation resistor by allowing the current to flow through the compensation resistor. The selection switch SW1 can change the compensation resistor connected to the third current source I3, enabling the third current source I3 to adjust the voltage drop across either the first compensation resistor R1 or the second compensation resistor R2 at a given time. The high-side current detection circuit of the present application embodiment selectively fixes the connection mode of the third current source I3 by using the selection switch SW1, based on the polarity (positive value or negative value) of the input offset voltage of the first operational amplifier U1, and individually adjusts the voltage drop of the first compensation resistor R1 or the second compensation resistor R2 to compensate for the input offset voltage.

Figure 5:
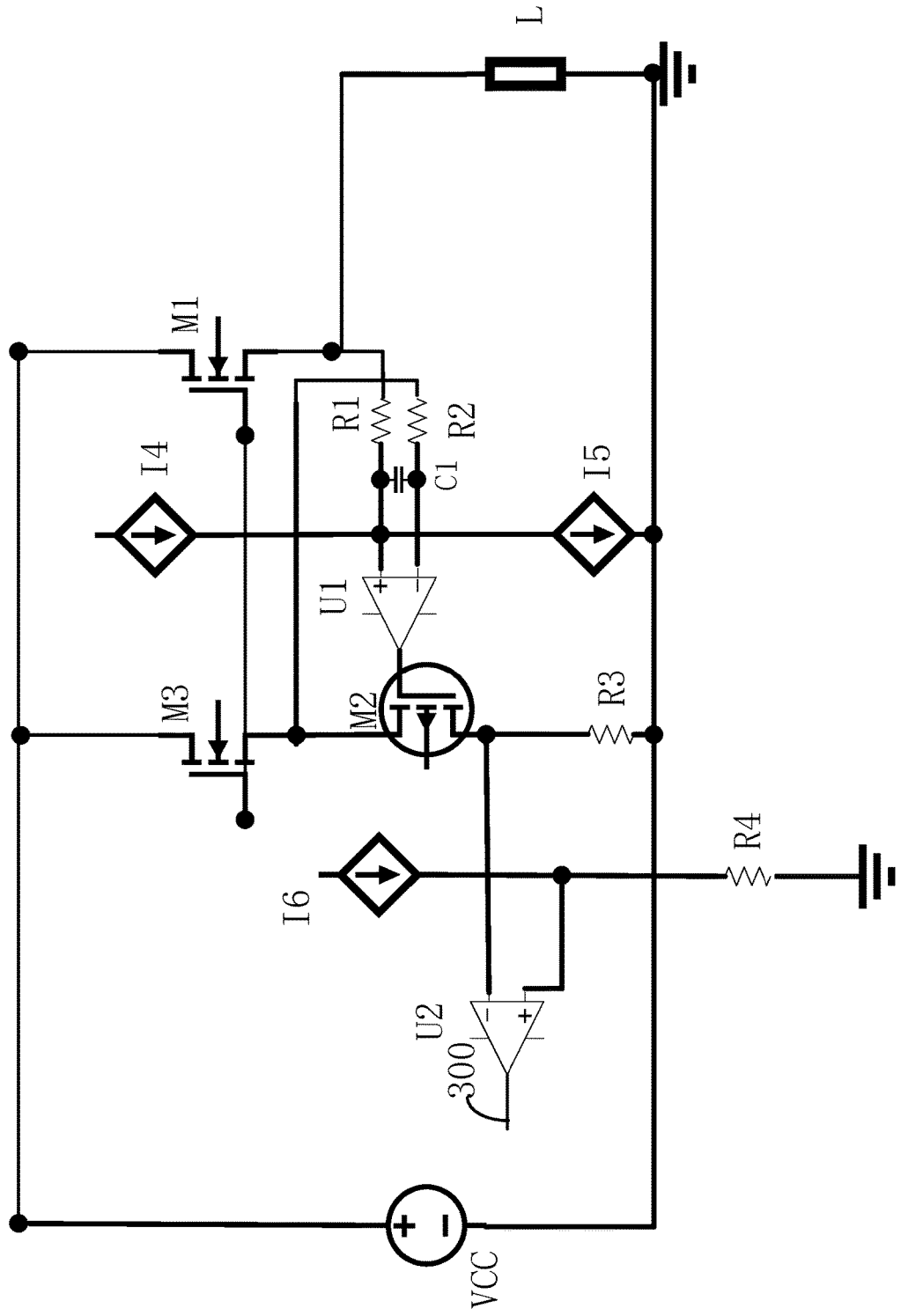
FIG. 5 is a schematic of a high-side current detection circuit provided by some embodiments of the present application.

In another preferred implementation method, as shown in FIG. 5, the offset compensation circuit 100 includes a fourth current source I4 and a fifth current source I5. The second terminal of the fourth current source I4 and the first terminal of the fifth current source I5 are connected to the inverting input terminal or the non-inverting input terminal of the first operational amplifier U1. The second terminal of the fifth current source I5 and the output terminal of the load L are both grounded. The first terminal of the fourth current source I4 is connected to a voltage source.

Specifically, in this implementation method, the fourth current source I4 and the fifth current source I5 are used to adjust the voltage drop across the corresponding compensation resistor by allowing the current to flow into or sink out of the compensation resistor. These two can be individually enabled according to the specific requirements, selectively increasing or decreasing the voltage drop across the compensation resistor (either the first compensation resistor R1 or the second compensation resistor R2) that these two current sources are connected to. The high-side current detection circuit of the present application embodiment, based on the polarity (positive value or negative value) of the input offset voltage of the first operational amplifier U1, selectively enables the fourth current source I4 or the fifth current source I5 to provide a source current or a sink current to adjust the voltage drop across the corresponding compensation resistor to compensate for the input offset voltage.

More specifically, as shown in FIG. 5, in some embodiments of this implementation method, the inverting input terminal and the non-inverting input terminal of the first operational amplifier U1 can be connected to a capacitor C1.

In some preferred implementation methods, the first transistor M1 and the third transistor M3 are NMOS transistors. The second transistor M2 is a PMOS transistor.

Specifically, the first terminal of the first transistor M1 is the drain of the NMOS transistor. The second terminal of the first transistor M1 is the source of the NMOS transistor, and the third terminal of the first transistor M1 is the gate of the NMOS transistor. The first terminal of the third transistor M3 is the drain of the NMOS transistor. The second terminal of the third transistor M3 is the source of the NMOS transistor, and the third terminal of the third transistor M3 is the gate of the NMOS transistor. The first terminal of the second transistor M2 is the source of the PMOS transistor. The second terminal of the second transistor M2 is the drain of the PMOS transistor, and the third terminal of the second transistor M2 is the gate of the PMOS transistor.

More specifically, due to the "virtual short" characteristic of the inverting input terminal and the non-inverting input terminal of the first operational amplifier U1 (which means that when the operational amplifier is in the linear state, the two input terminals can be regarded as equipotential, this characteristic is called "virtual short"), the first transistor M1 and the third transistor M3 form a common-source common-gate structure, ensuring that the ratio of the drain-source current of the third transistor M3 to the drain-source current of the first transistor M1 is consistent with the size ratio of the first transistor M1 to the third transistor M3.

In some preferred implementation methods, the gain calibration circuit 200 includes a sampling resistor R3, a second operational amplifier U2, and a threshold voltage circuit. The first terminal of the sampling resistor R3 is the first terminal of the gain calibration circuit 200, and the second terminal of the sampling resistor R3 is the second terminal of the gain calibration circuit 200. The non-inverting input terminal and the inverting input terminal of the second operational amplifier U2 are connected to the output terminal of the threshold voltage circuit and the second terminal of the sampling resistor R3, respectively. The output terminal of the second operational amplifier U2 is the detection terminal 300.

Specifically, the threshold voltage circuit can output a threshold voltage value representing a specific target current. The two input terminals of the second operational amplifier U2 are used to obtain the specific threshold voltage value and the voltage value at the second terminal of the sampling resistor R3. The second operational amplifier U2 can compare the threshold voltage value with the voltage value at the second terminal of the sampling resistor R3 and output the corresponding voltage difference, or output a higher voltage or a high/low-level signal. This enables the high-side current detection circuit of the present application embodiment to detect whether the load current meets the expected value based on the voltage difference or the high/low-level signal output by the second operational amplifier U2 (i.e., the detection signal output by the detection terminal 300).

More specifically, the threshold voltage value generated by the threshold voltage circuit corresponds to the voltage value generated at the second terminal of the sampling resistor R3, which is proportional to a specific target current. It represents a reference proportional relationship with the current flowing through the load L, indicating that when the voltage value at the second terminal of the sampling resistor R3 is equal to the threshold voltage value, the load current matches the reference current determined by the threshold voltage circuit. It should be understood that different threshold voltage values generated by the threshold voltage circuit allow the high-side current detection circuit in this embodiment to detect different load currents by comparing the voltage value at the second terminal of the sampling resistor R3 with the threshold voltage value. The detection signal output by the second operational amplifier U2 represents the relationship between the detected current and different target currents.

More specifically, in this implementation method, the gain error ΔG is caused by the mismatch between the first transistor M1 and the second transistor M2, and the resistance value error of the sampling resistor R3. This results in a voltage value at the sampling resistor R3 that has an error value positively correlated with the load current. Therefore, in this embodiment, the gain error ΔG can be compensated by adjusting the resistance value of the sampling resistor R3 or proportionally adjusting the threshold voltage value of the threshold voltage circuit. The adjustment process of the sampling resistor R3 can involve replacing the appropriate resistance value of the sampling resistor R3 according to the gain error ΔG to calibrate its resistance value. It can also involve connecting different resistors internally within the integrated circuit to form a new sampling resistor R3 for calibrating its resistance value. This adjustment process can compensate for the gain error ΔG generated under different load currents. The adjustment process of the threshold voltage value of the threshold voltage circuit can involve changing the output value of the threshold voltage to match the voltage value of the sampling resistor R3, effectively updating the reference proportional relationship between the current threshold voltage value and the load current. It can also involve adjusting the threshold voltage values in all reference proportional relationships based on the change ratio of the threshold voltage values before and after the change, so that the changed threshold voltage values can be compared and determined against the voltage value of the sampling resistor R3 to achieve load current detection.

In some preferred implementation methods, the threshold voltage circuit includes an analog-to-digital converter U3, and the output terminal of the analog-to-digital converter U3 serves as the output terminal of the threshold voltage circuit.

Specifically, the analog-to-digital converter U3 can modulate and output different threshold voltage values according to the application requirements, enabling the high-side current detection circuit in this embodiment to detect different amplitudes of load currents. The threshold voltage circuit allows for convenient adjustment of the threshold voltage values, facilitating the detection of load currents in the high-side current detection circuit of this embodiment.

In another preferred implementation method, the threshold voltage circuit includes a sixth current source I6 and a threshold resistor R4. The first terminal of the threshold resistor R4 is connected to the second terminal of the sixth current source I6 and the inverting input terminal of the second operational amplifier U2. The second terminal of the threshold resistor R4 is grounded. The first terminal of the sixth current source I6 is connected to a voltage source.

Specifically, in this implementation method, the threshold voltage value is the product of the current value output by the sixth current source I6 and the resistance value of the threshold resistor R4. Therefore, the threshold voltage value can be adjusted by changing the current value output by the sixth current source I6 and/or adjusting the resistance value of the threshold resistor R4 to enable the high-side current detection circuit in this embodiment to detect different amplitudes of load currents. The adjustment method of the threshold resistor R4 is similar to the adjustment method of the sampling resistor R3 and will not be repeated here. The threshold voltage circuit in this embodiment generates a more stable threshold voltage value, effectively ensuring the stability of current detection.

Figure 6:
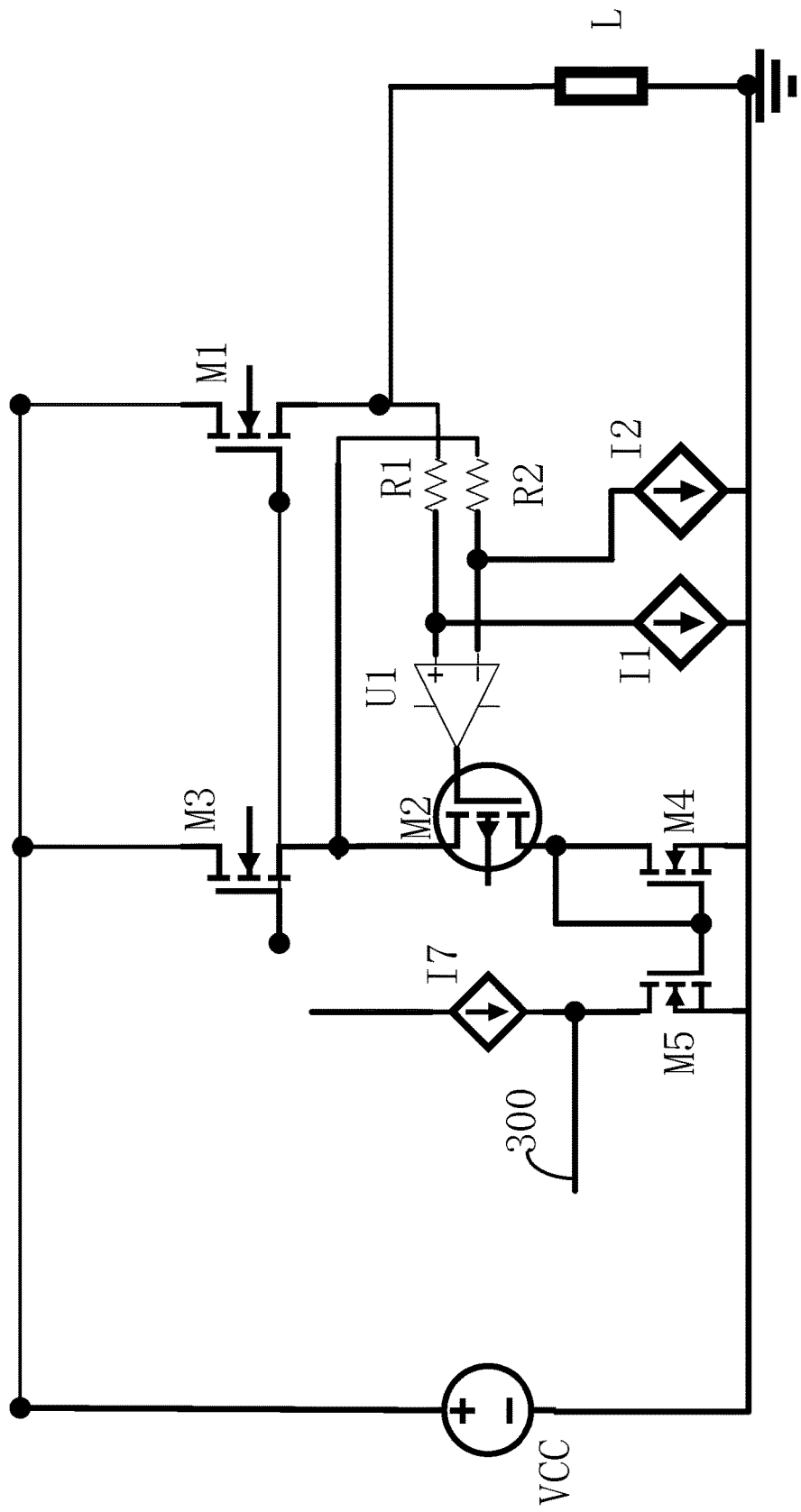
FIG. 6 is a schematic of a high-side current detection circuit provided by some embodiments of the present application.
Figure 7:
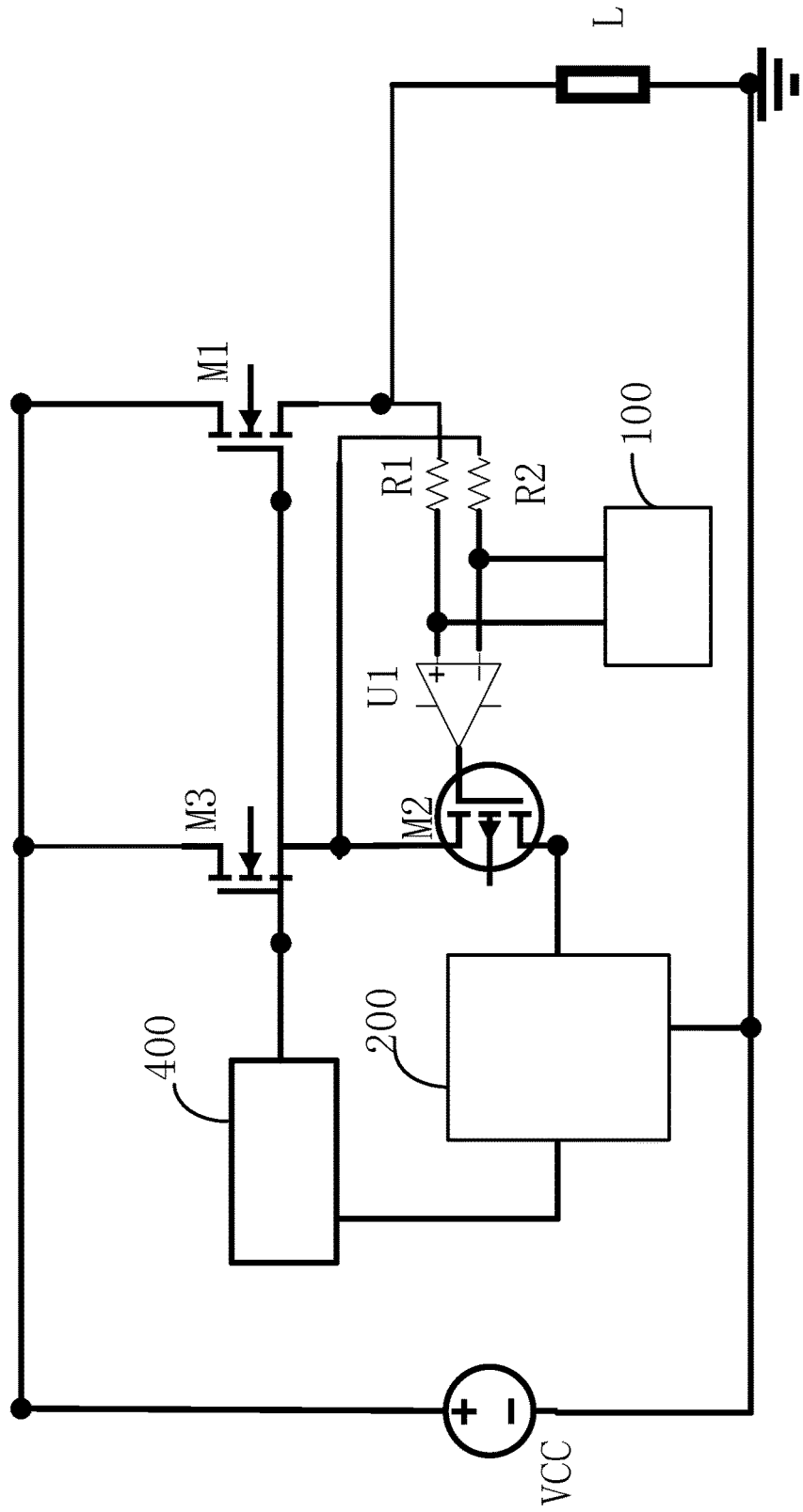
FIG. 7 is a schematic of an overcurrent protection circuit provided by some embodiments of the present application.

In another preferred implementation method, as shown in FIG. 6, the gain calibration circuit 200 includes a current mirror circuit and a seventh current source I7. The current mirror circuit has a current input terminal, a current output terminal, and a detection terminal 300. The current input terminal is the second terminal of the gain calibration circuit 200. The current output terminal is the first terminal of the gain calibration circuit 200. The detection terminal 300 is connected to the second terminal of the seventh current source I7. The first terminal of the seventh current source I7 is connected to a voltage source.

Specifically, the seventh current source I7 can output a reference current value representing a specific target current value. The current mirror circuit can generate a mirrored input current proportional to the current input terminal at the detection terminal 300. This mirrored input current cancels out the reference current value, resulting in a current difference at the detection terminal 300. This current difference reflects the relationship between the reference current value and the current at the current input terminal, allowing the high-side current detection circuit in this embodiment to detect whether the load current meets the expected value based on the current difference at the detection terminal 300. More specifically, the reference current value generated by the seventh current source I7 corresponds to the mirrored input current generated by a specific load current, indicating that when the current difference is zero, the load current matches the reference current value determined by the seventh current source I7. The high-side current detection circuit in this embodiment can detect different amplitudes of load currents by outputting different reference current values from the seventh current source I7, representing the relationship between the detected current and different target currents.

More specifically, in this embodiment, the gain error $\Delta G$ is caused by the mismatch between the first transistor M1 and the second transistor M2, resulting in an error value positively correlated with the load current in the current input of the current mirror circuit. Therefore, in this embodiment, the gain error $\Delta G$ can be compensated by adjusting the reference current value output by the seventh current source I7 in proportion. The adjustment process of the reference current value output by the seventh current source I7 can involve changing the reference current value output by the seventh current source I7 according to the gain error $\Delta G$ to match the current value input at the current input terminal, effectively updating the reference proportional relationship between the reference current value and the current input value. Additionally, based on the change ratio of the reference current values before and after the change, the reference current values in all reference proportional relationships can be adjusted, allowing the changed reference current values to be compared and determined against the current value input at the current input terminal (i.e., generating a current difference based on the mirrored input current generated by the current mirror circuit at the detection terminal 300) to achieve load current detection.

Furthermore, in some embodiments, changing the current mirror ratio of the current mirror circuit can achieve the calibration of the gain error $\Delta G$ and also scale the mirrored input current for comparison with the reference current value.

In some preferred embodiments, the voltage source can be an independent voltage source or the supply voltage VCC.

Specifically, the current sources need to be installed in the circuit. Therefore, the input terminals of the current sources in different embodiments need to be connected to the voltage source and integrated into the circuit. For example, the first terminals of the fourth current source I4, the sixth current source I6, and the seventh current source I7 are connected to the circuit via the voltage source. The voltage source can be an additional independent voltage source supplying voltage to the corresponding current sources (not shown in the figure), or it can be the supply voltage VCC of the high-side current detection circuit in this embodiment. The first terminals of the fourth current source I4, the sixth current source I6, and the seventh current source I7 in FIGS. 3, 5, 6, and 7 are represented by open circuits, indicating that these current sources can be connected to either of the two voltage sources based on the application requirements.

In some preferred embodiments, the current mirror circuit comprises the fourth transistor M4 and the fifth transistor M5. The first terminal of the fourth transistor M4 is the current input terminal. The second terminal of the fourth transistor M4 and the second terminal of the fifth transistor M5 are the current output terminals. The first terminal of the fifth transistor M5 is the detection terminal 300. The third terminal of the fourth transistor M4 is connected to the third terminal of the fifth transistor M5 and the first terminal of the fourth transistor M4.

Specifically, the current mirror circuit takes the current output by the second terminal of the second transistor M2 as the input current at the first terminal of the fourth transistor M4, generating a mirrored controlled current at the first terminal of the fifth transistor M5. This mirrored input current is used for current detection by generating a current difference with the reference current value output by the seventh current source I7. The current mirror circuit comprising the fourth transistor M4 and the fifth transistor M5 generates a mirrored input current that does not change with variations in the ambient temperature and has infinite internal resistance, improving the circuit stability of the high-side current detection circuit in this embodiment.

In some preferred embodiments, both the fourth transistor M4 and the fifth transistor M5 are NMOS transistors.

Specifically, the first terminal of the fourth transistor M4 is the drain of an NMOS transistor. The second terminal of the fourth transistor M4 is the source of an NMOS transistor. The third terminal of the fourth transistor M4 is the gate of an NMOS transistor. The first terminal of the fifth transistor M5 is the drain of an NMOS transistor. The second terminal of the fifth transistor M5 is the source of an NMOS transistor. The third terminal of the fifth transistor M5 is the gate of an NMOS transistor.

In some preferred embodiments, the current sources in the offset compensation circuit 100 and the gain calibration circuit 200 are adjustable current sources.

Specifically, as mentioned above, the offset compensation circuit 100 changes the voltage drop across the compensation resistor based on the input current or the output current, compensating for the input offset voltage of the first operational amplifier U1. Therefore, the current sources included in the offset compensation circuit 100 need to be adjustable current sources. Similarly, for the gain calibration circuit 200 including the current sources (the sixth current source I6 or the seventh current source I7), the output values of the current sources can be adjusted to change the reference proportional relationship of the load current, achieving gain calibration. Therefore, the current sources included in the gain calibration circuit 200 need to be adjustable current sources.

More specifically, the adjustable current source is preferably a current source circuit based on the output current of the bias current. Generally, the chip circuit has a bias current (Ibias), and the bias current combined with the current mirror can form a series of current sources that generate different amplitudes of the output current, thereby more effectively improving the utilization of the circuit resources.

To further explain the circuit structure of the high-side current detection circuit provided in this application embodiment, the following examples (Example 1 to Example 6) are used to illustrate the inventive concept of the high-side current detection circuit.

Example 1

As shown in FIG. 3, this embodiment provides a high-side current detection circuit comprising a first transistor M1, a second transistor M2, a third transistor M3, a first operational amplifier U1, a gain calibration circuit 200, an offset compensation circuit 100, and a detection terminal 300. The first terminal of the first transistor M1 is connected to the first terminal of the third transistor M3 and the power supply voltage VCC. The second terminal of the first transistor M1 is connected to the input terminal of the load L. The output terminal of the load L is connected to the first terminal of the gain calibration circuit 200. The second terminal of the third transistor M3 is connected to the first terminal of the second transistor M2. The third terminal of the first transistor M1 is connected to the third terminal of the third transistor M3. The second terminal and the third terminal of the second transistor M2 are connected to the second terminal of the gain calibration circuit 200 and the output terminal of the first operational amplifier U1 respectively. The non-inverting input terminal and the inverting input terminal of the first operational amplifier U1 are connected to the second terminal of the first transistor M1 and the second terminal of the third transistor M3, respectively, through the first compensation resistor R1 and the second compensation resistor R2. The output terminal of the gain calibration circuit 200 is the detection terminal 300. The offset compensation circuit 100 is connected to the non-inverting input terminal and/or the inverting input terminal of the first operational amplifier U1 to adjust the voltage drop on the first compensation resistor R1 and/or the second compensation resistor R2 for compensating the input offset voltage of the first operational amplifier U1. The offset compensation circuit 100 comprises a first current source I1 and a second current source I2. The first terminal of the first current source I1 is connected to the non-inverting input terminal of the first operational amplifier U1. The first terminal of the second current source I2 is connected to the inverting input terminal of the first operational amplifier U1. The second terminal of the first current source I1, the second terminal of the second current source I2, and the output terminal of the load L are all grounded. The gain calibration circuit 200 comprises a sampling resistor R3, a second operational amplifier U2, and a threshold voltage circuit. The first terminal of the sampling resistor R3 is the first terminal of the gain calibration circuit 200. The second terminal of the sampling resistor R3 is the second terminal of the gain calibration circuit 200. The non-inverting input terminal and the inverting input terminal of the second operational amplifier U2 are connected to the output terminal of the threshold voltage circuit and the second terminal of the sampling resistor R3, respectively. The output terminal of the second operational amplifier U2 is the detection terminal 300. The threshold voltage circuit comprises an analog-to-digital converter U3 (as shown in FIG. 4), or comprises a sixth current source I6 and a threshold resistor R4 (as shown in FIGS. 3 and 5). The first terminal of the threshold resistor R4 is connected to the second terminal of the sixth current source I6 and the non-inverting input terminal of the second operational amplifier U2. The second terminal of the threshold resistor R4 is grounded. The first terminal of the sixth current source I6 is connected to a voltage source.

Example 2

As shown in FIG. 4, this embodiment provides a high-side current detection circuit, which differs from Example 1 in the configuration of the offset compensation circuit 100. In this embodiment, the offset compensation circuit 100 comprises a third current source I3 and a selection switch SW1. The first terminal of the third current source I3 is selectively connected to the non-inverting input terminal or the inverting input terminal of the first operational amplifier U1 through the selection switch SW1. The second terminal of the third current source I3 and the output terminal of the load L are both grounded.

Example 3

As shown in FIG. 5, this embodiment provides a high-side current detection circuit, which differs from Example 1 in the configuration of the offset compensation circuit 100. In this embodiment, the offset compensation circuit 100 comprises a fourth current source I4 and a fifth current source I5. The second terminal of the fourth current source I4 and the first terminal of the fifth current source I5 are connected to the non-inverting input terminal or the inverting input terminal of the first operational amplifier U1. The second terminal of the fifth current source I5 and the output terminal of the load L are both grounded. The first terminal of the fourth current source I4 is connected to a voltage source.

Example 4

As shown in FIG. 6, this embodiment provides a high-side current detection circuit, which is a modified embodiment of Example 1. It differs from Example 1 in the configuration of the gain calibration circuit 200. In this embodiment, the gain calibration circuit 200 comprises a current mirror circuit and a seventh current source I7. The current mirror circuit has a current input terminal, a current output terminal, and a detection terminal 300. The current input terminal is the second terminal of the gain calibration circuit 200. The current output terminal is the first terminal of the gain calibration circuit 200. The detection terminal 300 is connected to the second terminal of the seventh current source I7. The first terminal of the seventh current source I7 is connected to a voltage source. The current mirror circuit comprises a fourth transistor M4 and a fifth transistor M5. The first terminal of the fourth transistor M4 is the current input terminal. The second terminal of the fourth transistor M4 and the second terminal of the fifth transistor M5 are both current output terminals. The first terminal of the fifth transistor M5 is the detection terminal 300. The third terminal of the fourth transistor M4 is connected to the third terminal of the fifth transistor M5 and the first terminal of the fourth transistor M4.

Example 5

This example provides a high-side current detection circuit, which is a modification of Example 2. The difference lies in the configuration of the gain calibration circuit 200. In this example, the gain calibration circuit 200 comprises a current mirror circuit and a seventh current source I7. The current mirror circuit has a current input terminal, a current output terminal, and a detection terminal 300. The current input terminal is the second terminal of the gain calibration circuit 200. The current output terminal is the first terminal of the gain calibration circuit 200. The detection terminal 300 is connected to the second terminal of the seventh current source I7. The first terminal of the seventh current source I7 is connected to a voltage source. The current mirror circuit comprises a fourth transistor M4 and a fifth transistor M5. The first terminal of the fourth transistor M4 is the current input terminal. The second terminal of the fourth transistor M4 and the second terminal of the fifth transistor M5 are both current output terminals. The first terminal of the fifth transistor M5 is the detection terminal 300. The third terminal of the fourth transistor M4 is connected to the third terminal of the fifth transistor M5 and the first terminal of the fourth transistor M4.

Example 6

This example provides a high-side current detection circuit, which is a modification of Example 3. The difference lies in the configuration of the gain calibration circuit 200. In this example, the gain calibration circuit 200 comprises a current mirror circuit and a seventh current source I7. The current mirror circuit has a current input terminal, a current output terminal, and a detection terminal 300. The current input terminal is the second terminal of the gain calibration circuit 200. The current output terminal is the first terminal of the gain calibration circuit 200. The detection terminal 300 is connected to the second terminal of the seventh current source I7. The first terminal of the seventh current source I7 is connected to a voltage source. The current mirror circuit comprises a fourth transistor M4 and a fifth transistor M5. The first terminal of the fourth transistor M4 is the current input terminal. The second terminal of the fourth transistor M4 and the second terminal of the fifth transistor M5 are both current output terminals. The first terminal of the fifth transistor M5 is the detection terminal 300. The third terminal of the fourth transistor M4 is connected to the third terminal of the fifth transistor M5 and the first terminal of the fourth transistor M4.

It is worth mentioning that when using any of the high-side current detection circuits in embodiments 1-6 in practical applications, the offset error $\Delta Vos$ can be obtained by performing multi-point measurements on at least two different output currents. The offset compensation circuit 100 can then be adjusted to calibrate the offset error $\Delta Vos$ by adjusting the voltage drop on the first compensation resistor R1 and/or the second compensation resistor R2. The gain error $\Delta G$ can be calibrated using the gain calibration circuit 200, thus completing the entire calibration process of the high-side current detection circuit.

In a second aspect, the overcurrent protection circuit is a commonly used circuit for protecting load L, such as integrated circuits, and electronic devices. It belongs to the application circuit of the current detection circuit and often faces the problem of detection error in existing high-side current detection circuits. Under the condition of varying operating current of the load L, the existing overcurrent protection circuit is prone to inaccurate current limiting detection, leading to false triggering or failure to trigger, which may result in damage to the load L. Therefore, please refer to FIGS. 7, 8, 10, and 11. Some embodiments of this application also provide an overcurrent protection circuit for preventing overcurrent in the load L. The overcurrent protection circuit includes a first transistor M1, a second transistor M2, a third transistor M3, a first operational amplifier U1, a gain calibration circuit 200, an offset compensation circuit 100, and a driving circuit 400. The first terminal of the first transistor M1 is connected to the first terminal of the third transistor M3 and the power supply voltage VCC. The second terminal of the first transistor M1 is connected to the input terminal of the load L. The output terminal of the load L is connected to the first terminal of the gain calibration circuit 200. The second terminal of the third transistor M3 is connected to the first terminal of the second transistor M2. The third terminal of the first transistor M1 is connected to the third terminal of the third transistor M3 and the second terminal of the driving circuit 400. The second terminal and the third terminal of the second transistor M2 are connected to the second terminal of the gain calibration circuit 200 and the output terminal of the first operational amplifier U1, respectively. The non-inverting input terminal and the inverting input terminal of the first operational amplifier U1 are connected to the second terminal of the first transistor M1 and the second terminal of the third transistor M3 respectively through the first compensation resistor R1 and the second compensation resistor R2.

The offset compensation circuit 100 is connected to the non-inverting input terminal and/or the inverting input terminal of the first operational amplifier U1 to adjust the voltage drop on the first compensation resistor R1 and/or on the second compensation resistor R2 for compensating the input offset voltage of the first operational amplifier U1. The first terminal of the driving circuit 400 is connected to the output terminal of the gain calibration circuit 200. The driving circuit 400 controls the conduction resistance of the first transistor M1 based on the output of the gain calibration circuit 200, limiting the conduction current of the first transistor M1 to a preset current limit value when the load current exceeds the current limit.

Specifically, the overcurrent protection circuit in the disclosed embodiments is an application circuit of the high-side current detection circuit provided in the first aspect. The difference is that the overcurrent protection circuit includes a driving circuit 400 connected to the detection terminal 300 of the high-side current detection circuit. The driving circuit 400 controls the conduction states of the first transistor M1 and the third transistor M3 based on the electrical parameters output from the detection terminal 300. Since the electrical parameters output from the detection terminal 300 reflect the amplitude of the load current, the driving circuit 400 can determine whether the load L experiences overcurrent and promptly increase the conduction resistance of the first transistor M1 and the third transistor M3 to protect the load L.

The overcurrent protection circuit in the disclosed embodiments compensates for the input offset voltage of the first operational amplifier U1 by connecting the first compensation resistor R1, the second compensation resistor R2, and the offset compensation circuit 100 to the input side of the first operational amplifier U1. This helps to calibrate the offset error $\Delta Vos$ of the entire circuit. Combined with the gain calibration circuit 200 for calibrating the gain error $\Delta G$, the detection error of the overcurrent protection circuit is divided into a fixed offset error $\Delta Vos$ and a dynamically changing gain error $\Delta G$, enabling calibration to effectively eliminate detection errors of the overcurrent protection circuit at different load currents. This ensures more accurate detection results for determining whether the load L experiences overcurrent, avoiding false triggering or failure to trigger in overcurrent protection.

Figure 8:
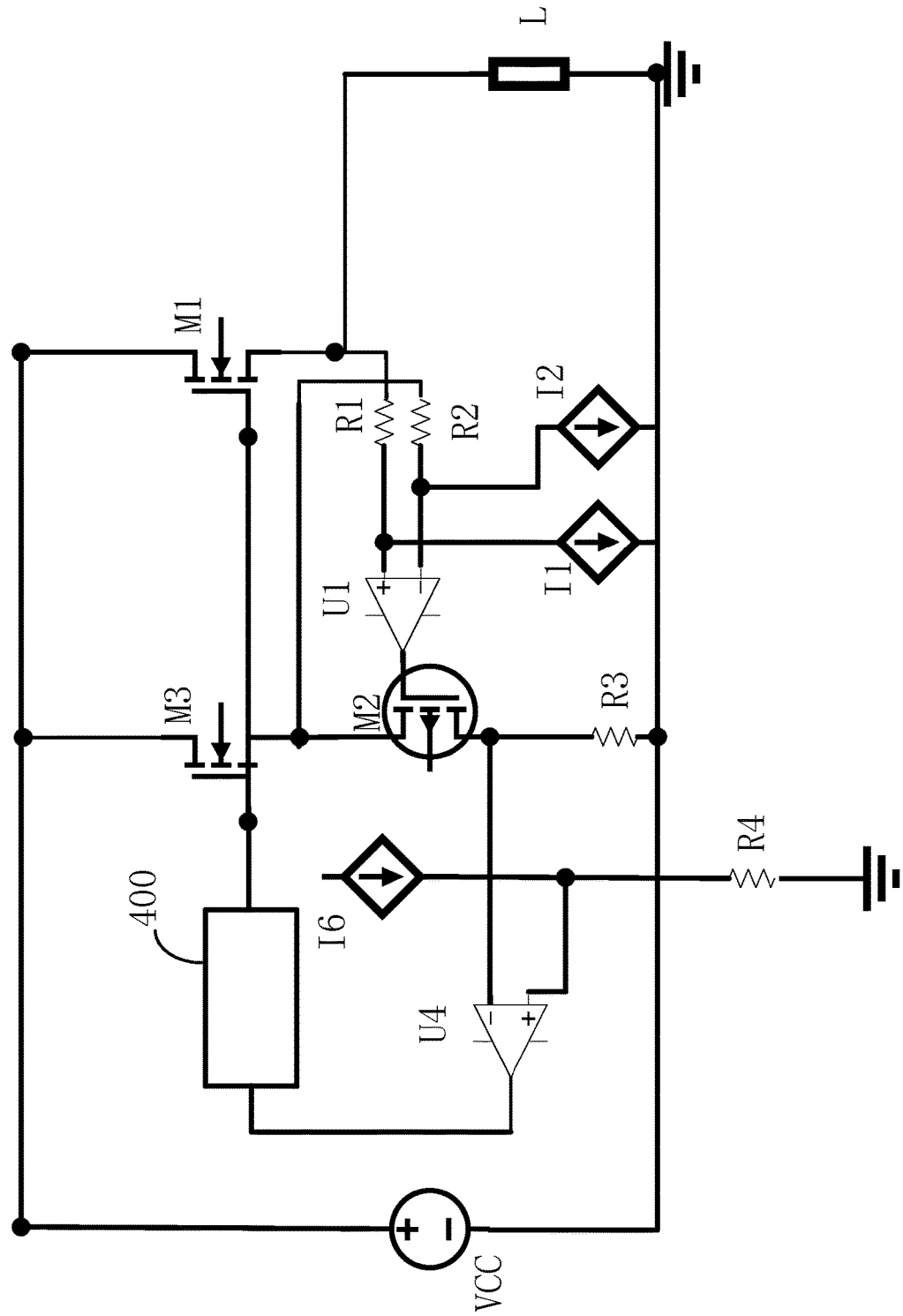
FIG. 8 is a schematic of an overcurrent protection circuit provided by some embodiments of the present application.

In some preferred embodiments, as shown in FIG. 8, the gain calibration circuit 200 includes a sampling resistor R3, an error amplification circuit U4, and a threshold voltage circuit. The first terminal of the sampling resistor R3 is connected to the first terminal of the gain calibration circuit 200. The second terminal of the sampling resistor R3 is connected to the second terminal of the gain calibration circuit 200. The output terminal of the error amplification circuit U4 is the output terminal of the gain calibration circuit 200. The non-inverting input terminal and the inverting input terminal of the error amplification circuit U4 are connected to the output terminal of the threshold voltage circuit and the second terminal of the sampling resistor R3, respectively. The error amplification circuit U4 generates a control signal based on the voltage information at the second terminal of the sampling resistor R3 and the output voltage of the threshold voltage circuit, controlling the conduction resistance of the first transistor M1 through the driving circuit 400.

Specifically, in this embodiment, the driving circuit 400 is configured to bias the third terminal of the first transistor M1 based on its input voltage value. The error amplification circuit U4 amplifies the voltage difference between the output threshold voltage of the threshold voltage circuit and the voltage value at the second terminal of the sampling resistor R3. This voltage difference reflects the relationship between the load current and the preset current limit value for the load L. When the load current exceeds the preset current limit value, the error amplification circuit U4 triggers the driving circuit 400 to reduce the voltage at the third terminal of the first transistor M1 and the third transistor M3, thereby increasing the conduction resistance of the first transistor M1 and the third transistor M3 to achieve current limiting and overcurrent protection for the load L.

Figure 10:
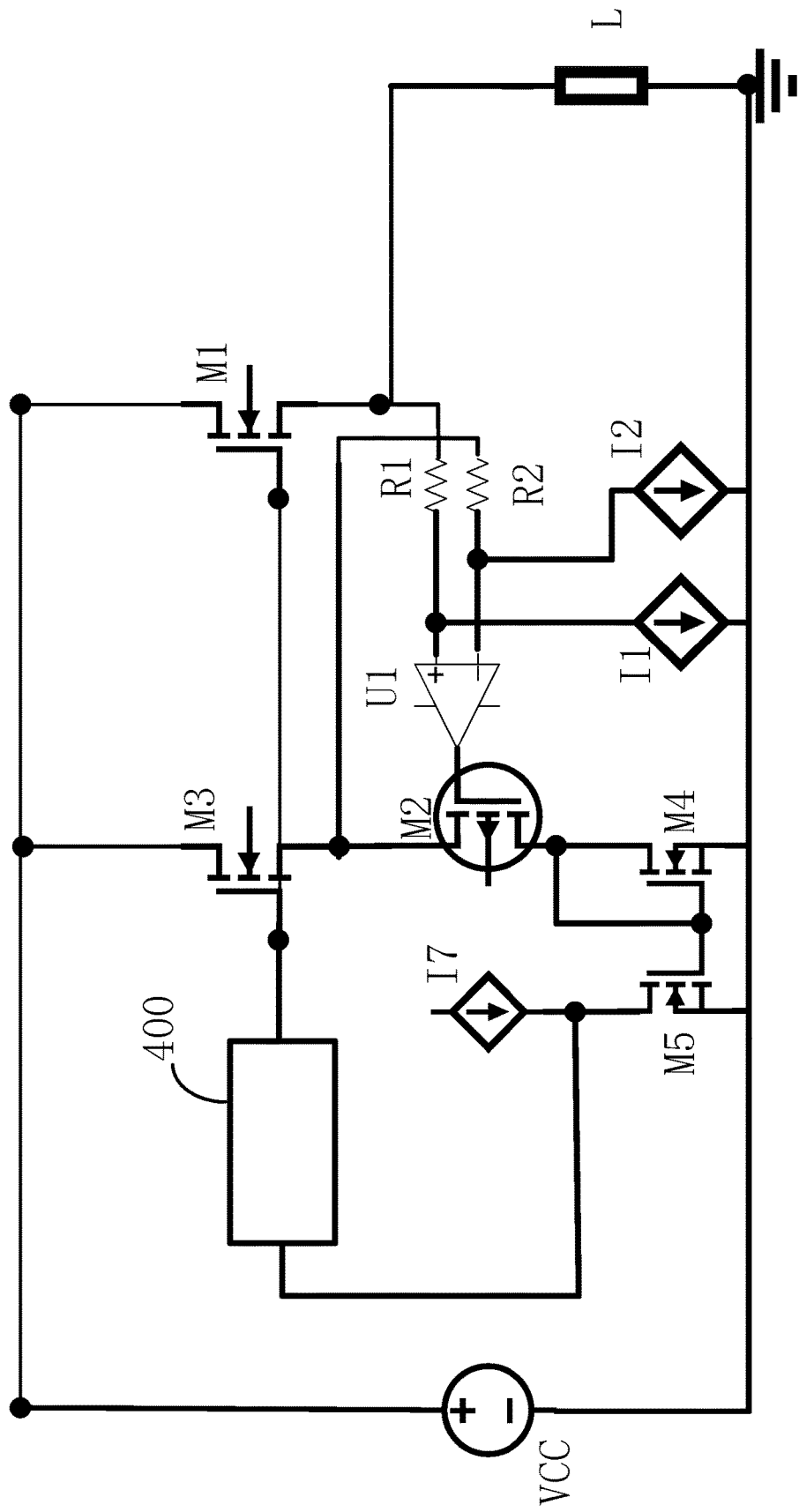
FIG. 10 is a schematic of an overcurrent protection circuit provided by some embodiments of the present application.

In some preferred embodiments, as shown in FIG. 10, the gain calibration circuit 200 includes a current mirror circuit and a seventh current source I7. The current mirror circuit has a current input terminal, a current output terminal, and a detection terminal 300. The current input terminal is the second terminal of the gain calibration circuit 200, and the current output terminal is the first terminal of the gain calibration circuit 200. The detection terminal 300 is connected to the second terminal of the seventh current source I7. The first terminal of the seventh current source I7 is connected to a voltage source. The current mirror circuit outputs a current difference from the detection terminal 300, allowing the driving circuit 400 to adjust the conduction resistance of the first transistor M1 based on the current difference.

Specifically, in this embodiment, the driving circuit 400 is configured to bias the third terminal of the first transistor M1 based on the input current value. As mentioned before, the detection terminal 300 generates a current difference, which reflects the relationship between the load current and the preset current limit value. When the load current exceeds the preset current limit value, the current difference output from the detection terminal 300 triggers the driving circuit 400 to reduce the voltage at the third terminal of the first transistor M1 and the third transistor M3, thereby increasing the conduction resistance of the first transistor M1 and the third transistor M3 to achieve current limiting and overcurrent protection for the load L.

Figure 11:
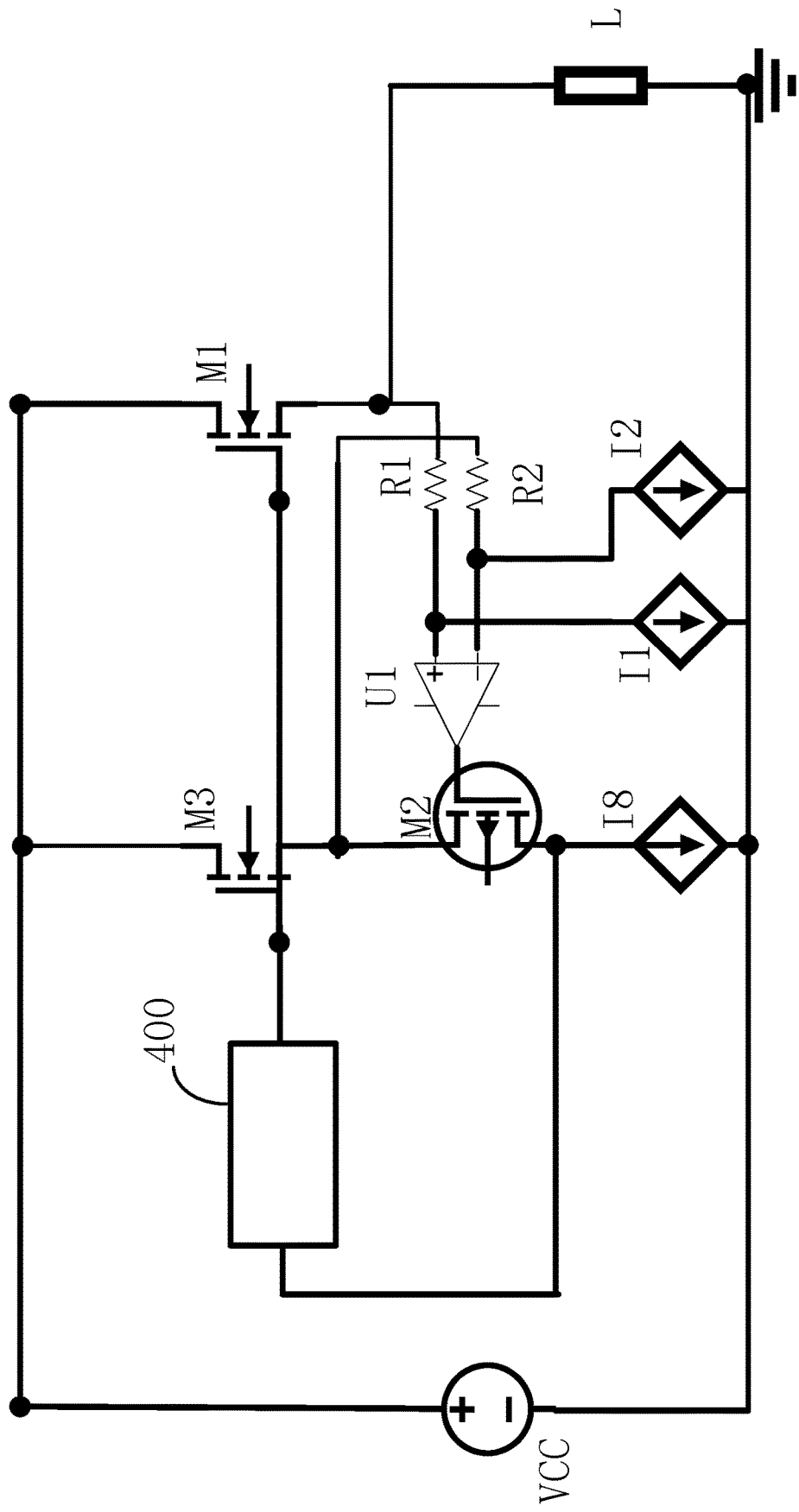
FIG. 11 is a schematic of an overcurrent protection circuit provided by some embodiments of the present application.

In some preferred embodiments, as shown in FIG. 11, the gain calibration circuit 200 includes an eighth current source 18. The second terminal of the eighth current source 18 is the first terminal of the gain calibration circuit 200, and the first terminal of the eighth current source 18 is the second terminal and the output terminal of the gain calibration circuit 200. The eighth current source 18 outputs a current difference from the first terminal, allowing the driving circuit 400 to adjust the conduction resistance of the first transistor M1 based on the current difference.

Specifically, in this embodiment, the driving circuit 400 is configured to bias the third terminal of the first transistor M1 based on its input current value (i.e., the aforementioned current difference). The current difference generated at the second terminal of the gain calibration circuit 200 is the difference between the current flowing through the second transistor M2, which corresponds to the load current, and the output current of the eighth current source 18, which represents the preset current limit value. This current difference reflects the relationship between the load current and the preset current limit value. When the load current exceeds the preset current limit value, the current difference output from the first terminal of the eighth current source 18 triggers the driving circuit 400 to lower the voltage at the third terminal of the first transistor M1 and the third transistor M3, thereby increasing the conduction resistance of the first transistor M1 and the third transistor M3 to achieve current limiting and overcurrent protection for the load L.

Specifically, in the calibration process of the present disclosed embodiments, the overcurrent protection circuit can be used to calibrate the offset error $\Delta Vos$ and the gain error $\Delta G$ using the following efficient and convenient calibration method.

Figure 13:
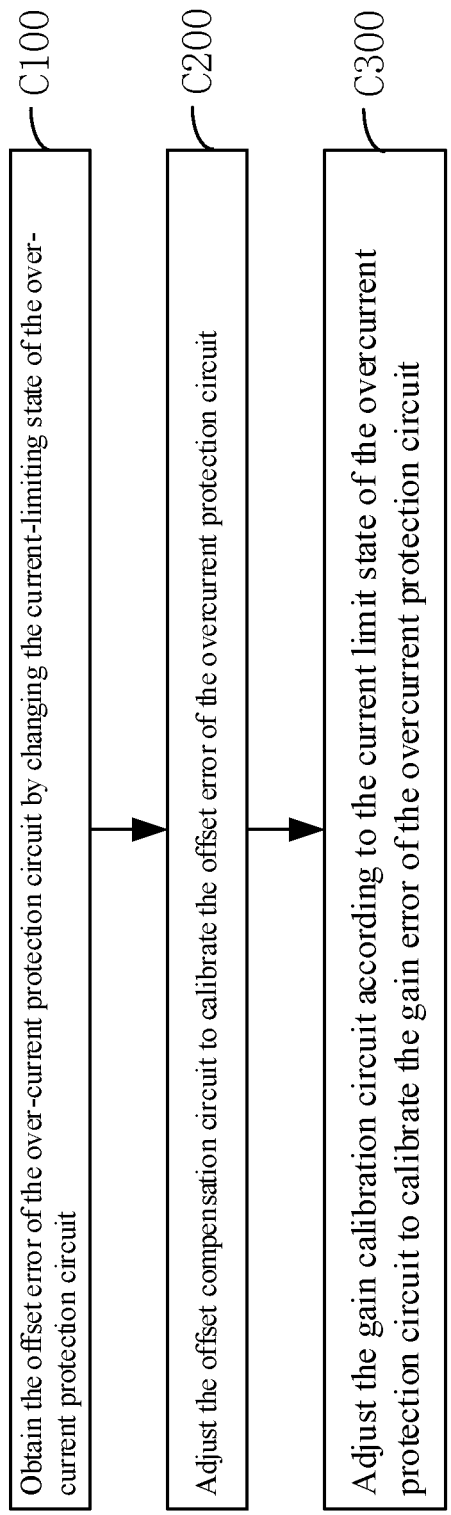
FIG. 13 is a flowchart of a calibration method provided by some embodiments of the present application.

In the third aspect, please refer to FIG. 13. Some embodiments of the present disclosure also provide a calibration method for calibrating the overcurrent protection circuit provided in the second aspect. The calibration method includes the following steps:

C100: obtain the offset error $\Delta Vos$ of the overcurrent protection circuit by changing the current limiting state of the overcurrent protection circuit.

C200: adjust the offset compensation circuit 100 to calibrate the offset error $\Delta Vos$ of the overcurrent protection circuit.

C300: adjust the gain calibration circuit 200 based on the current limiting state of the overcurrent protection circuit to calibrate the gain error $\Delta G$ of the overcurrent protection circuit.

Specifically, this calibration method utilizes the current limiting function to sequentially calibrate the offset error ΔVos and the gain error ΔG. It compensates for the offset error ΔVos that does not change with the load current and then calibrates the gain error ΔG that changes with the load current. This further improves the calibration accuracy, ensuring that the overcurrent protection circuit can accurately identify the current limiting state.

The calibration method of the present disclosed embodiments is used to calibrate the overcurrent protection circuit provided in the second aspect. This calibration method first obtains the offset error ΔVos based on the current limiting state. It enables fast calibration of the offset error ΔVos, followed by the calibration of the gain error ΔG, effectively eliminating detection errors of the overcurrent protection circuit at different load currents. This allows the overcurrent protection circuit to determine whether the load L is experiencing overcurrent based on more accurate current detection results, avoiding false triggering or failure to trigger in overcurrent protection.

To further illustrate the circuit structure of the overcurrent protection circuit and the corresponding calibration method process provided in the present disclosed embodiments, the calibration process of the overcurrent protection circuit will be explained in more detail in conjunction with Examples 7-9:

Example 7

As shown in FIG. 8, the calibration method is applied to an overcurrent protection circuit comprising the first transistor M1, the second transistor M2, the third transistor M3, the first operational amplifier U1, the gain calibration circuit 200, the offset compensation circuit 100, and the driving circuit 400. The first terminal of the first transistor M1 and the first terminal of the third transistor M3 are connected to the power supply voltage VCC. The second terminal of the first transistor M1 is connected to the input terminal of the load L. The output terminal of the load L is connected to the first terminal of the gain calibration circuit 200. The second terminal of the third transistor M3 is connected to the first terminal of the second transistor M2. The third terminal of the first transistor M1 and the third terminal of the third transistor M3 are connected to the second terminal of the driving circuit 400. The second terminal and the third terminal of the second transistor M2 are connected to the second terminal of the gain calibration circuit 200 and the output terminal of the first operational amplifier U1 respectively. The non-inverting input terminal and the inverting input terminal of the first operational amplifier U1 are connected to the second terminal of the first transistor M1 and the second terminal of the third transistor M3 via the first compensation resistor R1 and the second compensation resistor R2 respectively. The offset compensation circuit 100 is connected to the non-inverting input terminal and/or the inverting input terminal of the first operational amplifier U1 to adjust the voltage drop across the first compensation resistor R1 and/or the second compensation resistor R2 for compensating the input offset voltage of the first operational amplifier U1. The first terminal of the driving circuit 400 is connected to the output terminal of the gain calibration circuit 200. The driving circuit 400 controls the conduction resistance of the first transistor M1 based on the output of the gain calibration circuit 200 to limit the conduction current of the first transistor M1 to a preset current limit value when the load current exceeds the preset current limit value.

In this example, the gain calibration circuit 200 includes a sampling resistor R3, an error amplification circuit U4, and a threshold voltage circuit. The first terminal of the sampling resistor R3 is the first terminal of the gain calibration circuit 200. The second terminal of the sampling resistor R3 is the second terminal of the gain calibration circuit 200. The output terminal of the error amplification circuit U4 is the output terminal of the gain calibration circuit 200. The non-inverting input terminal and the inverting input terminal of the error amplification circuit U4 are connected to the output terminal of the threshold voltage circuit and the second terminal of the sampling resistor R3 respectively. The error amplification circuit U4 generates a control signal based on the voltage information at the second terminal of the sampling resistor R3 and the output voltage of the threshold voltage circuit, thereby allowing the driving circuit 400 to adjust the conduction resistance of the first transistor M1 according to the control signal.

Figure 14:
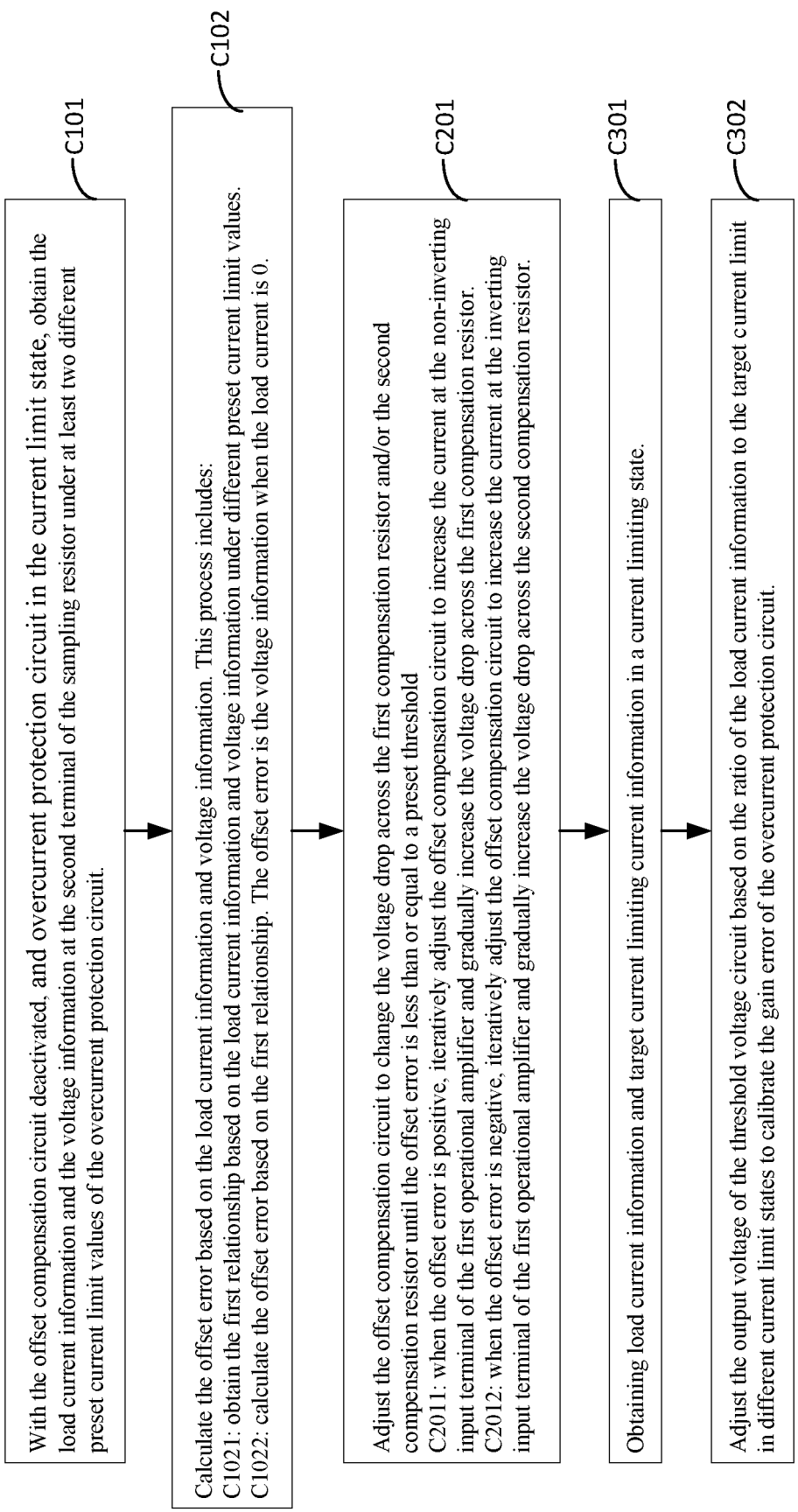
FIG. 14 is a detailed flowchart of a calibration method provided by some embodiments of the present application.

As shown in FIG. 14, the calibration method for the overcurrent protection circuit in this embodiment includes the following steps:

C100: obtain the offset error ΔVos of the overcurrent protection circuit by changing the current limiting state of the overcurrent protection circuit. This process includes:

C101: with the offset compensation circuit 100 deactivated and overcurrent protection circuit in the current limit state, obtain the load current information and the voltage information at the second terminal of the sampling resistor R3 under at least two different preset current limit values of the overcurrent protection circuit. It should be noted that when the overcurrent protection circuit is in closed-loop stable operation, the voltages at the two input terminals of the error amplifier U4 are equal (i.e., the voltage at the output terminal of the threshold voltage circuit represents the voltage information at the second terminal of the sampling resistor R3. The voltage information at the second terminal of the sampling resistor R3 can be measured or calculated based on the voltage at the output terminal of the threshold voltage circuit).

Figure 9:
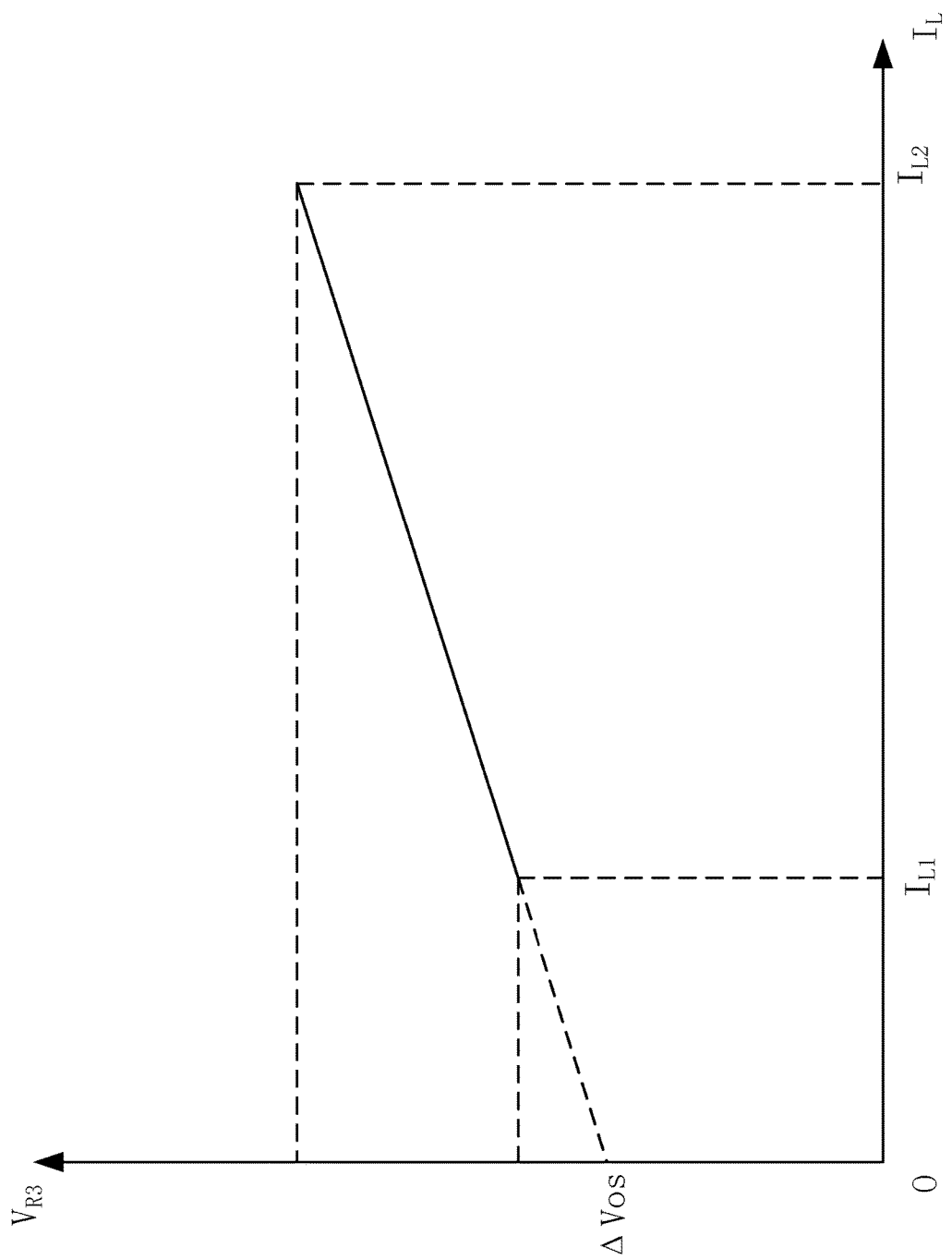
FIG. 9 is a schematic diagram of obtaining an offset error based on the first relationship.

C102: calculate the offset error ΔVos based on the load current information and voltage information. This process includes:

C1021: obtain the first relationship based on the load current information and voltage information under different preset current limit values. The first relationship represents the variation of voltage information with respect to change in load current information. As shown in FIG. 9, the first relationship is a linear relationship. This step involves obtaining a linear relationship between voltage information and load current information based on at least two sets of load current information and voltage information. It should be noted that according to Equation (1), the first relationship is a proportional linear relationship. In FIG. 9, VR3 represents the voltage information at the second terminal of the sampling resistor R3. IL represents the load current information, and IL1 and IL2 correspond to the load current information under two different current limit states.

C1022: calculate the offset error ΔVos based on the first relationship. The offset error ΔVos is the voltage information when the load current is 0. As shown in FIG. 9, the offset error ΔVos is the intercept on the Y-axis of the extension line of the straight line in FIG. 9 (i.e., the voltage information at the intersection point).

C200: adjust the offset compensation circuit 100 to calibrate the offset error ΔVos of the overcurrent protection circuit. This process includes:

C201: adjust the offset compensation circuit 100 to change the voltage drop across the first compensation resistor R1 and/or the second compensation resistor R2 until the offset error ΔVos is less than or equal to a preset threshold, thus completing the calibration of the offset error ΔVos of the overcurrent protection circuit. The adjustment process of the offset compensation circuit 100 is selected based on its configuration. In this embodiment, an iterative adjustment process is preferred, which includes:

C2011: when the offset error ΔVos is positive, iteratively adjust the offset compensation circuit 100 to increase the current at the non-inverting input terminal of the first operational amplifier U1 and gradually increase the voltage drop across the first compensation resistor R1.

C2012: when the offset error ΔVos is negative, iteratively adjust the offset compensation circuit 100 to increase the current at the inverting input terminal of the first operational amplifier U1 and gradually increase the voltage drop across the second compensation resistor R2.

C300: adjust the gain calibration circuit 200 based on the current limiting state of the overcurrent protection circuit to calibrate the gain error ΔG of the overcurrent protection circuit. This process includes:

C301: obtain the load current information and the target current limit information in a current limit state.

C302: adjust the output voltage of the threshold voltage circuit based on the ratio of the load current information to the target current limit in different current limit states to calibrate the gain error ΔG of the overcurrent protection circuit.

Specifically, the target current limit information represents the expected current value flowing through the load in the current limit state.

In Embodiment 8, as shown in FIG. 10, the difference between the overcurrent protection circuit to which the calibration method is applied and the overcurrent protection circuit in Embodiment 7 lies in the configuration of the gain calibration circuit 200. In this embodiment, the gain calibration circuit 200 includes a current mirror circuit and a seventh current source I7. The current mirror circuit has a current input terminal, a current output terminal, and a detection terminal 300. The current input terminal is the second terminal of the gain calibration circuit 200, and the current output terminal is the first terminal of the gain calibration circuit 200. The detection terminal 300 is connected to the second terminal of the seventh current source I7, where the current provided by the second terminal of the seventh current source I7 represents the preset current limit value. The first terminal of the seventh current source I7 is connected to a voltage source. The current mirror circuit outputs a current difference at the detection terminal 300, which allows the driving circuit 400 to adjust the conduction resistance of the first transistor M1 based on the current difference.

In this embodiment, the calibration method is based on the current difference output by the gain calibration circuit 200 for calibration, and to distinguish it from other embodiments. The offset error is denoted as ΔIos.

Figure 15:
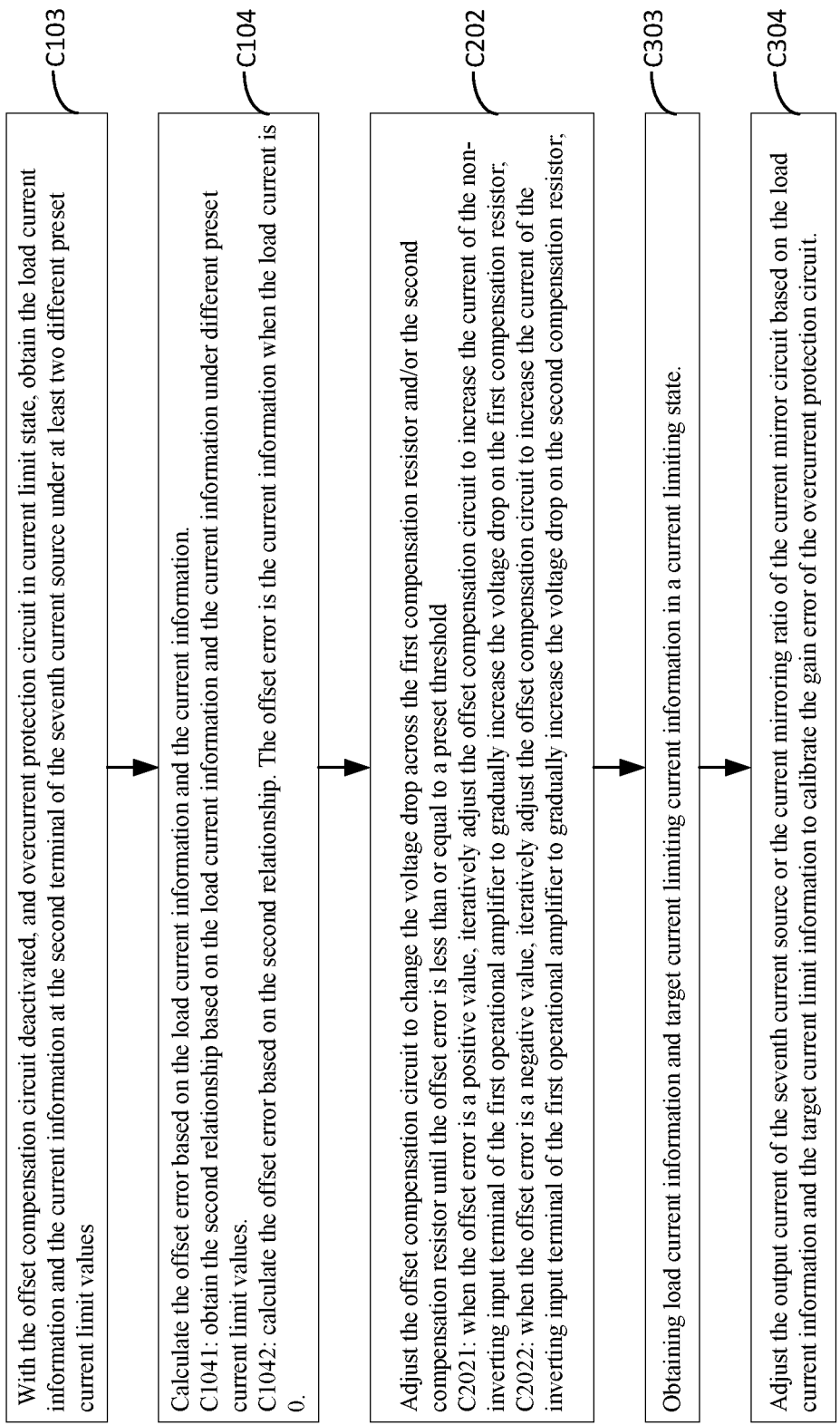
FIG. 15 is a detailed flowchart of a calibration method provided by some embodiments of the present application.

As shown in FIG. 15, the calibration method for the overcurrent protection circuit in this embodiment includes the following steps:

C100: obtain the offset error ΔIos of the overcurrent protection circuit by changing the current limiting state of the overcurrent protection circuit. This process includes:

C103: with the offset compensation circuit 100 deactivated, and overcurrent protection circuit in current limit state, obtain the load current information and the current information at the second terminal of the seventh current source I7 under at least two different preset current limit values of the overcurrent protection circuit. It should be noted that when the overcurrent protection circuit is in closed-loop stable operation, the output current at the detection terminal 300 (i.e., the difference between the current provided by the second terminal of the seventh current source I7 and the current mirrored to the output terminal through the current mirror circuit representing the load current) is fixed. Therefore, the relationship between the preset current limit value and the actual load current can be obtained by measuring or calculating the current at the second terminal of the seventh current source I7.

Figure 12:
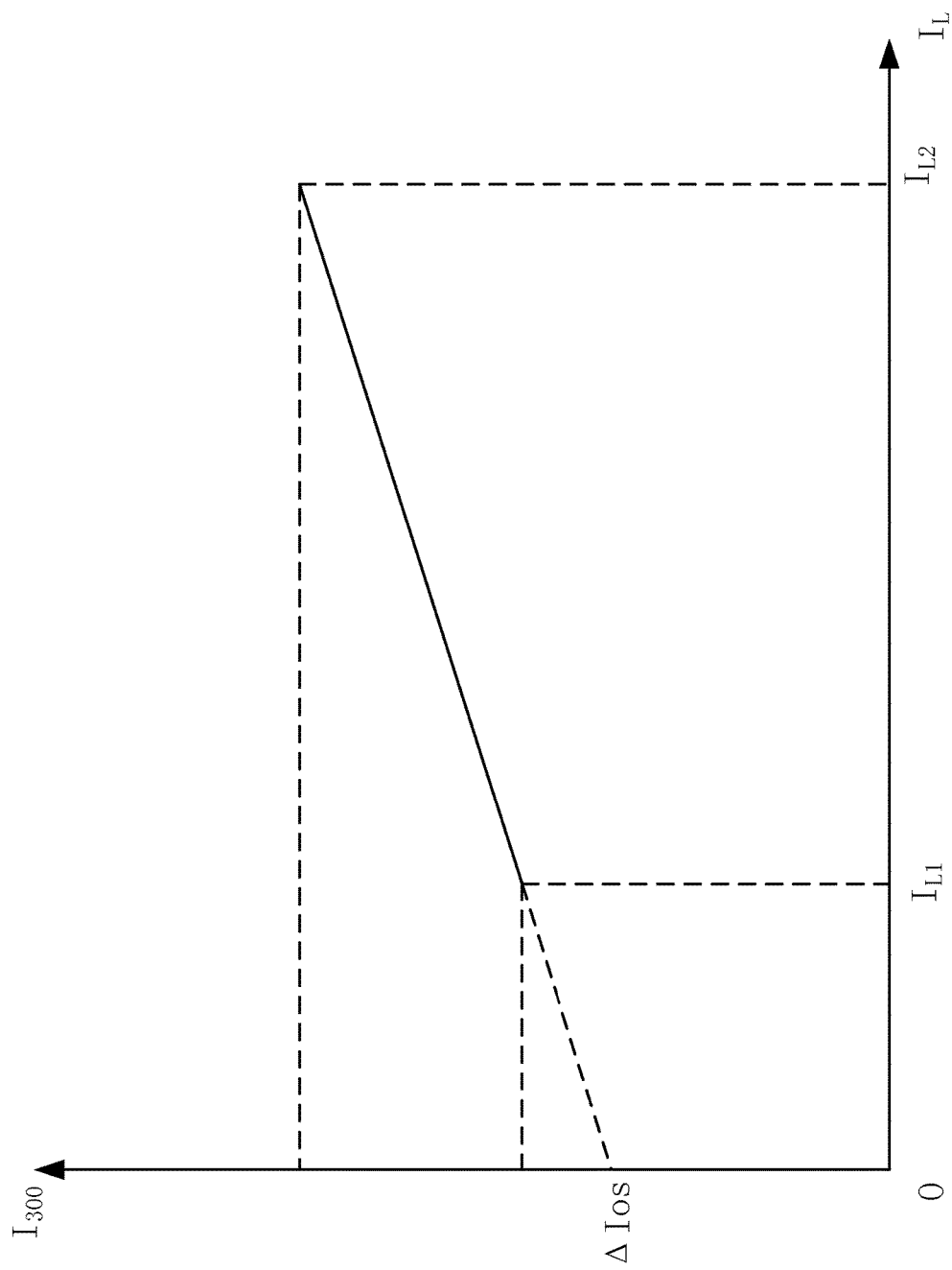
FIG. 12 is a diagram of obtaining an offset error based on the second relationship.

C104: calculate the offset error ΔIos based on the load current information and the current information. This process includes:

C1041: obtain the second relationship based on the load current information and the current information under different preset current limit values. The second relationship represents the variation of the current information with respect to the load current information. As shown in FIG. 12, the second relationship is a linear relationship. This step involves obtaining a linear relationship between the current information and the load current information based on at least two sets of load current information and current information. It should be noted that the second relationship is a proportional linear relationship. In this embodiment, I300 represents the current information at the second terminal of the seventh current source I7. IL represents the load current information, and IL1 and IL2 correspond to the load current information under two different current limit states.

C1042: calculate the offset error ΔIos based on the second relationship. The offset error ΔIos is the current information when the load current is 0. As shown in FIG. 12, the offset error ΔIos is the intercept on the Y-axis of the extension line of the straight line in FIG. 12 (i.e., the current information at the intersection point).

C200: adjust the offset compensation circuit 100 to calibrate the offset error ΔIos of the overcurrent protection circuit. This process includes:

C202: adjust the offset compensation circuit 100 to change the voltage drop across the first compensation resistor R1 and/or the second compensation resistor R2 until the offset error ΔIos is less than or equal to a preset threshold, thus completing the calibration of the offset error ΔIos of the overcurrent protection circuit. The adjustment process of the offset compensation circuit 100 is selected based on its configuration. In this embodiment, an iterative adjustment process is preferred, which includes:

C2021: when the offset error ΔIos is positive, iteratively adjust the offset compensation circuit 100 to increase the current at the non-inverting input terminal of the first operational amplifier U1 and gradually increase the voltage drop across the first compensation resistor R1.

C2022: when the offset error ΔIos is negative, iteratively adjust the offset compensation circuit 100 to increase the current at the inverting input terminal of the first operational amplifier U1 and gradually increase the voltage drop across the second compensation resistor R2.

C300: adjust the gain calibration circuit 200 based on the current limiting state of the overcurrent protection circuit to calibrate the gain error ΔG of the overcurrent protection circuit. This process includes:

C303: obtain the load current information and the target current limit information in a current limit state.

C304: adjust the output current of the seventh current source I7 or the current mirroring ratio of the current mirror circuit based on the load current information and the target current limit information to calibrate the gain error ΔG of the overcurrent protection circuit.

In Embodiment 9, as shown in FIG. 11, the difference between the overcurrent protection circuit to which the calibration method is applied and the overcurrent protection circuit in Embodiment 8 lies in the configuration of the gain calibration circuit 200. In this embodiment, the gain calibration circuit 200 includes an eighth current source 18. The second terminal of the eighth current source 18 is the first terminal of the gain calibration circuit 200, and the first terminal of the eighth current source 18 is the second terminal and the output terminal of the gain calibration circuit 200. The output terminal outputs a current difference, which allows the driving circuit 400 to adjust the conduction resistance of the first transistor M1 based on the current difference.

In this embodiment, the calibration method is based on the current difference output by the gain calibration circuit 200 for calibration, and to distinguish it from other embodiments. The offset error is denoted as ΔIos.

Figure 16:
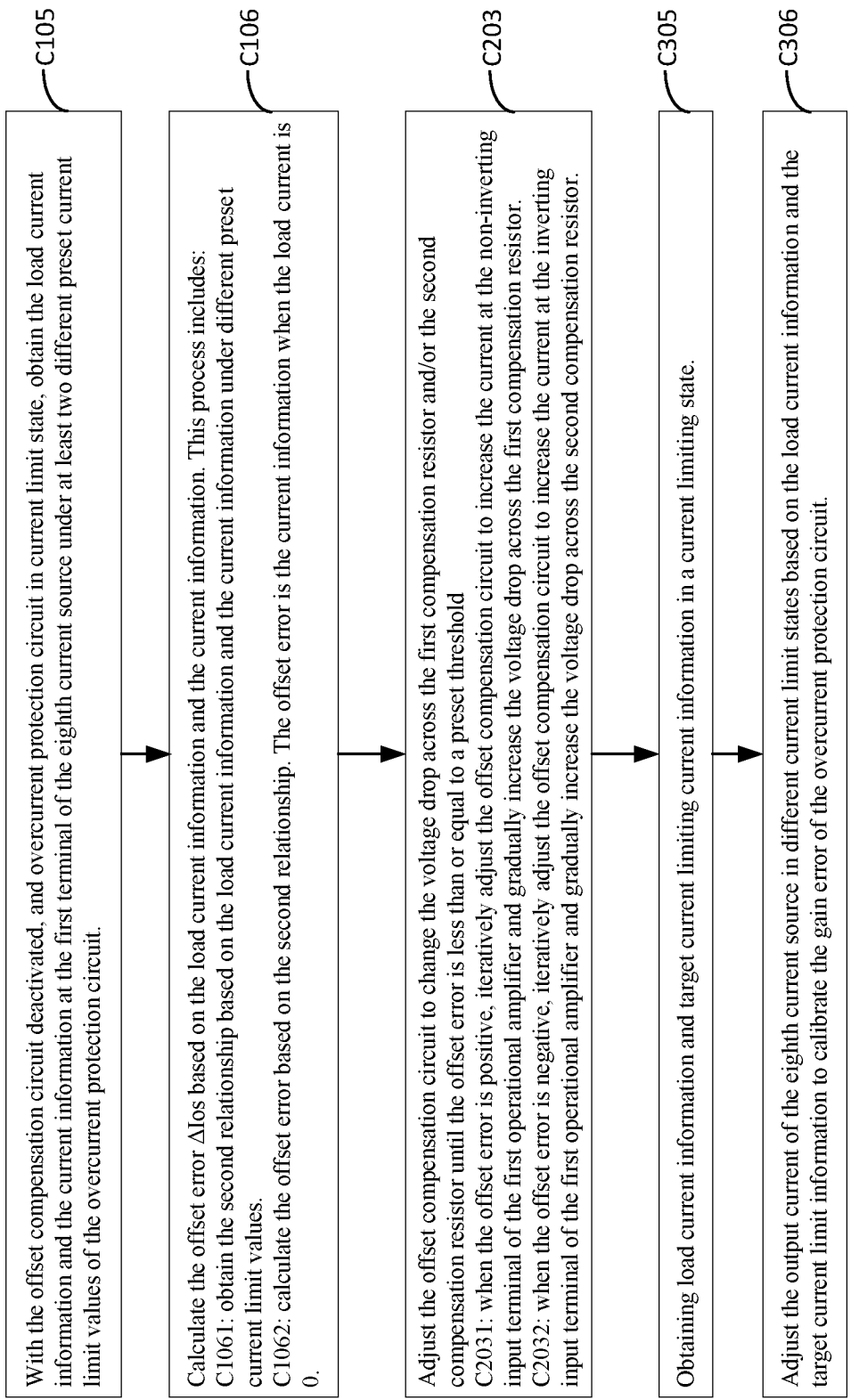
FIG. 16 is a detailed flowchart of a calibration method provided by some embodiments of the present application.

As shown in FIG. 16, the calibration method for the overcurrent protection circuit in this embodiment includes the following steps:

C100: obtain the offset error ΔIos of the overcurrent protection circuit by changing the current limiting state of the overcurrent protection circuit. This process includes:

C105: with the offset compensation circuit 100 deactivated, and overcurrent protection circuit in current limit state, obtain the load current information and the current information at the first terminal of the eighth current source 18 under at least two different preset current limit values of the overcurrent protection circuit. It should be noted that when the overcurrent protection circuit is in closed-loop stable operation, the difference between the current provided by the eighth current source 18 and the current at the second terminal of the second transistor M2 (which represents the load current) is fixed. Therefore, the relationship between the preset current limit value and the actual load current can be obtained by measuring or calculating the current at the first terminal of the eighth current source 18. In this embodiment, I300 represents the current information at the first terminal of the eighth current source 18. IL represents the load current information. IL1 and IL2 correspond to the load current information under two different current limit states.

C106: calculate the offset error ΔIos based on the load current information and the current information. This process includes:

C1061: obtain the second relationship based on the load current information and the current information under different preset current limit values. The second relationship represents the variation of the current information with respect to the load current information. As shown in FIG. 12, the second relationship is a linear relationship. This step involves obtaining a linear relationship between the current information and the load current information based on at least two sets of load current information and current information. It should be noted that the second relationship is a proportional linear relationship.

C1062: calculate the offset error ΔIos based on the second relationship. The offset error ΔIos is the current information when the load current is 0. As shown in FIG. 12, the offset error ΔIos is the intercept on the Y-axis of the extension line of the straight line in FIG. 12 (i.e., the current information at the intersection point).

C200: adjust the offset compensation circuit 100 to calibrate the offset error ΔIos of the overcurrent protection circuit. This process includes:

C203: adjust the offset compensation circuit 100 to change the voltage drop across the first compensation resistor R1 and/or the second compensation resistor R2 until the offset error ΔIos is less than or equal to a preset threshold, thus completing the calibration of the offset error ΔIos of the overcurrent protection circuit. The adjustment process of the offset compensation circuit 100 is selected based on its configuration. In this embodiment, an iterative adjustment process is preferred, which includes:

C2031: when the offset error ΔIos is positive, iteratively adjust the offset compensation circuit 100 to increase the current at the non-inverting input terminal of the first operational amplifier U1 and gradually increase the voltage drop across the first compensation resistor R1.

C2032: when the offset error ΔIos is negative, iteratively adjust the offset compensation circuit 100 to increase the current at the inverting input terminal of the first operational amplifier U1 and gradually increase the voltage drop across the second compensation resistor R2.

C300: adjust the gain calibration circuit 200 based on the current limiting state of the overcurrent protection circuit to calibrate the gain error ΔG of the overcurrent protection circuit. This process includes:

C305: obtain the load current information and the target current limit information in a current limit state.

C306: adjust the output current of the eighth current source 18 in different current limit states based on the load current information and the target current limit information to calibrate the gain error ΔG of the overcurrent protection circuit.

In addition, in some embodiments, the present application also provides an electronic device, which includes the high-side current detection circuit provided in the first aspect or the overcurrent protection circuit provided in the second aspect. Specifically, an electronic device refers to a device comprising electronic components such as integrated circuits, transistors, and electron tubes, which applies electronic technology (including software) and includes electronic computers as well as devices controlled by electronic computers such as robots, CNC systems, or programmable logic controllers.

In this embodiment of the present application, the high-side current detection circuit is used for current detection of one or more load devices in an electronic device, while the overcurrent protection circuit is used for overcurrent protection of one or more load devices in an electronic device.

In summary, the present embodiment of the application provides a high-side current detection circuit, an overcurrent protection circuit, a calibration method, and an electronic device. The overcurrent protection circuit comprises the high-side current detection circuit. Both the overcurrent protection circuit and the high-side current detection circuit compensate for the input offset voltage of the first operational amplifier U1 by connecting the first compensation resistor R1, the second compensation resistor R2, and the offset compensation circuit 100 to the input side of the first operational amplifier U1. This calibration process compensates for the offset error ΔVos of the entire circuit. Combined with the gain calibration circuit 200, it calibrates the gain error ΔG, effectively separating the detection errors of the overcurrent protection circuit and the high-side current detection circuit into a fixed offset error ΔVos and a dynamic gain error ΔG that changes with the load current. This calibration process helps to eliminate the detection errors of the high-side current detection circuit under different load currents.

In the embodiments provided in this application, it should be understood that the disclosed circuits and methods can be implemented in other ways. The described circuit embodiments are merely illustrative. For example, the division of units is only a logical functional division, and there may be alternative divisions in actual implementation. Additionally, multiple units or components can be combined or integrated into another system, and some features may be ignored or not implemented. The coupling or direct coupling and communication connections displayed or discussed between them can be indirect coupling or communication connections through communication interfaces, circuits, or units, and can be electrical, mechanical, or other forms.

Furthermore, the units described as separate components may or may not be physically separated, and the components shown as units may or may not be physical units. They can be located in one place or distributed across multiple network units. The selection of partial or complete units can be made based on actual needs to achieve the objectives of the present embodiment.

Moreover, in each embodiment of the present application, the functional modules can be integrated together to form an independent part or exist separately as individual modules. Alternatively, two or more modules can be integrated to form an independent part.

In this document, relational terms such as "first" and "second" are used merely to distinguish one entity or operation from another, without necessarily implying any actual relationship or order between these entities or operations.

The above description is only an embodiment of the present application and is not intended to limit the scope of the present application. Various modifications and changes can be made by those skilled in the art without departing from the spirit and principles of the present application. Any modifications, equivalents, improvements, etc., made within the spirit and principles of the present application should be included within the scope of the present application.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An overcurrent protection circuit for preventing overcurrent in a load, the overcurrent protection circuit comprising:
a first transistor, a second transistor, a third transistor, a first operational amplifier, a gain calibration circuit, an offset compensation circuit, and a driving circuit, wherein:
a first terminal of the first transistor is connected to a first terminal of the third transistor and a power supply voltage;
a second terminal of the first transistor is connected to an input terminal of the load;
an output terminal of the load is connected to a first terminal of the gain calibration circuit;
a second terminal of the third transistor is connected to a first terminal of the second transistor;
a third terminal of the first transistor is connected to a third terminal of the third transistor and a second terminal of the driving circuit;
a second terminal and a third terminal of the second transistor are connected to a second terminal of the gain calibration circuit and an output terminal of the first operational amplifier, respectively;
a non-inverting input terminal and an inverting input terminal of the first operational amplifier are connected to the second terminal of the first transistor and the second terminal of the third transistor via a first compensation resistor and a second compensation resistor, respectively;
the offset compensation circuit is connected to the non-inverting input terminal and/or the inverting input terminal of the first operational amplifier to adjust a voltage drop on the first compensation resistor and/or the second compensation resistor to compensate for an input offset voltage of the first operational amplifier;
a first terminal of the driving circuit is connected to an output terminal of the gain calibration circuit; and
the driving circuit is used to control a conduction resistance of the first transistor based on an output of the gain calibration circuit in order to limit a conduction current of the first transistor to a predetermined current value when a load current exceeds a current limit.

2. The overcurrent protection circuit according to claim 1, wherein:
the gain calibration circuit comprises a sampling resistor, an error amplification circuit, and a threshold voltage circuit, and wherein:
a first terminal of the sampling resistor is the first terminal of the gain calibration circuit;
a second terminal of the sampling resistor is the second terminal of the gain calibration circuit;
an output terminal of the error amplification circuit is the output terminal of the gain calibration circuit;
a non-inverting input terminal and an inverting input terminal of the error amplification circuit are connected to an output terminal of the threshold voltage circuit and the second terminal of the sampling resistor, respectively; and
the error amplification circuit generates a control signal based on voltage information at the second terminal of the sampling resistor and an output voltage of the threshold voltage circuit, so as to adjust the conduction resistance of the first transistor using the driving circuit according to the control signal.

3. The overcurrent protection circuit according to claim 1, wherein:
the gain calibration circuit comprises a current mirror circuit and a seventh current source, and wherein:
the current mirror circuit has a current input terminal, a current output terminal, and a detection terminal;
the current input terminal is the second terminal of the gain calibration circuit;
the current output terminal is the first terminal of the gain calibration circuit;
the detection terminal is connected to a second terminal of the seventh current source;
a first terminal of the seventh current source is connected to a voltage source; and
the current mirror circuit outputs a current difference through the detection terminal, so that the driving circuit adjusts the conduction resistance of the first transistor based on the current difference.

4. The overcurrent protection circuit according to claim 1, wherein:
the gain calibration circuit comprises an eighth current source, and wherein:
a second terminal of the eighth current source is the first terminal of the gain calibration circuit;
a first terminal of the eighth current source is both the second terminal and the output terminal of the gain calibration circuit; and
the eighth current source outputs a current difference through the first terminal of the eighth current source, so that the driving circuit adjusts the conduction resistance of the first transistor based on the current difference.

5. The overcurrent protection circuit according to claim 1, wherein:
the offset compensation circuit comprises a first current source and a second current source, and wherein:
a first terminal of the first current source is connected to the non-inverting input terminal of the first operational amplifier;
a first terminal of the second current source is connected to the inverting input terminal of the first operational amplifier; and
a second terminal of the first current source, a second terminal of the second current source, and the output terminal of the load are all grounded, and wherein the first current source and the second current source are adjustable current sources.

6. The overcurrent protection circuit according to claim 1, wherein:
the offset compensation circuit comprises a third current source and a switch, and wherein:
a first terminal of the third current source is selectively connected to the non-inverting input terminal or the inverting input terminal of the first operational amplifier via the switch; and
a second terminal of the third current source and the output terminal of the load are both grounded, and wherein the third current source is an adjustable current source.

7. The overcurrent protection circuit according to claim 1, wherein:
the offset compensation circuit comprises a fourth current source and a fifth current source, and wherein:
a second terminal of the fourth current source and a first terminal of the fifth current source are connected to the non-inverting input terminal or the inverting input terminal of the first operational amplifier;
a second terminal of the fifth current source and the output terminal of the load are both grounded; and
a first terminal of the fourth current source is connected to a voltage source, and wherein the fourth current source and the fifth current source are adjustable current sources.

8. A calibration method for calibrating an overcurrent protection circuit, the calibration method comprising:
obtaining an offset error of the overcurrent protection circuit by changing a current limiting state of the overcurrent protection circuit;
adjusting an offset compensation circuit to calibrate the offset error of the overcurrent protection circuit; and
adjusting a gain calibration circuit based on the current limiting state of the overcurrent protection circuit to calibrate a gain error of the overcurrent protection circuit, wherein the overcurrent protection circuit comprises a first transistor, a second transistor, a third transistor, a first operational amplifier, a gain calibration circuit, an offset compensation circuit, and a driving circuit, and wherein:
the driving circuit is configured to receive a signal generated by the gain calibration circuit and generate a gate drive signal applied to the first transistor and the third transistor.

9. The calibration method according to claim 8, wherein:
a first terminal of the first transistor is connected to a first terminal of the third transistor and a power supply voltage;
a second terminal of the first transistor is connected to an input terminal of the load;
an output terminal of the load is connected to a first terminal of the gain calibration circuit;
a second terminal of the third transistor is connected to a first terminal of the second transistor;
a third terminal of the first transistor is connected to a third terminal of the third transistor and a second terminal of the driving circuit;
a second terminal and a third terminal of the second transistor are connected to a second terminal of the gain calibration circuit and an output terminal of the first operational amplifier, respectively;
a non-inverting input terminal and an inverting input terminal of the first operational amplifier are connected to the second terminal of the first transistor and the second terminal of the third transistor via a first compensation resistor and a second compensation resistor, respectively;
the offset compensation circuit is connected to the non-inverting input terminal and/or the inverting input terminal of the first operational amplifier to adjust a voltage drop on the first compensation resistor and/or the second compensation resistor to compensate for an input offset voltage of the first operational amplifier;
a first terminal of the driving circuit is connected to an output terminal of the gain calibration circuit; and
the driving circuit is used to control a conduction resistance of the first transistor based on an output of the gain calibration circuit in order to limit a conduction current of the first transistor to a predetermined current value when a load current exceeds a current limit.

10. The calibration method according to claim 9, wherein:
the gain calibration circuit comprises a sampling resistor, an error amplification circuit, and a threshold voltage circuit, and wherein:
a first terminal of the sampling resistor is a first terminal of the gain calibration circuit, a second terminal of the sampling resistor is a second terminal of the gain calibration circuit, an output terminal of the error amplification circuit is an output terminal of the gain calibration circuit;

a non-inverting input terminal and an inverting input terminal of the error amplification circuit are connected to an output terminal of the threshold voltage circuit and the second terminal of the sampling resistor, respectively;

the error amplification circuit generates a control signal based on voltage information at the second terminal of the sampling resistor and an output voltage of the threshold voltage circuit, so that the driving circuit adjusts a conduction resistance of the first transistor according to the control signal, wherein the step of obtaining the offset error of the overcurrent protection circuit by changing the current limiting state of the overcurrent protection circuit includes:

obtaining load current information and the voltage information at the second terminal of the sampling resistor in at least two different predetermined current limiting states of the overcurrent protection circuit under a compensation effect of the offset compensation circuit; and calculating and obtaining the offset error based on the load current information and the voltage information.

11. The calibration method according to claim 10, wherein:

the step of calculating and obtaining the offset error based on the load current information and the voltage information includes:

obtaining a first relationship based on the load current information and the voltage information in different predetermined current limiting states, and wherein the first relationship represents a variation relationship of the voltage information with respect to the load current information; and calculating and obtaining the offset error, and wherein the offset error corresponds to the voltage information when the load current information is zero.

12. The calibration method according to claim 10, wherein:

the step of adjusting the gain calibration circuit based on the current limiting state of the overcurrent protection circuit to calibrate the gain error of the overcurrent protection circuit includes:

obtaining the load current information and target current limiting information in one current limiting state; and adjusting the output voltage of the threshold voltage circuit in different current limiting states based on a proportional relationship between the load current information and the target current limiting information to calibrate the gain error of the overcurrent protection circuit.

13. The calibration method according to claim 8, wherein:

the gain calibration circuit comprises a current mirror circuit and a seventh current source, and wherein:

the current mirror circuit has a current input terminal, a current output terminal, and a detection terminal;

the current input terminal is a second terminal of the gain calibration circuit;

the current output terminal is a first terminal of the gain calibration circuit;

the detection terminal is connected to a second terminal of the seventh current source;

a first terminal of the seventh current source is connected to a voltage source; and the current mirror circuit outputs a current difference through the detection terminal, so that the driving circuit adjusts a conduction resistance of the first transistor based on the current difference, and wherein the step of obtaining the offset error of the overcurrent protection circuit by changing the current limiting state of the overcurrent protection circuit includes:

obtaining load current information and current information at the second terminal of the seventh current source in at least two different predetermined current limiting states of the overcurrent protection circuit under a compensation effect of the offset compensation circuit; and calculating and obtaining the offset error based on the load current information and the current information.

14. The calibration method according to claim 13, wherein:

the step of adjusting the gain calibration circuit based on the current limiting state of the overcurrent protection circuit to calibrate the gain error of the overcurrent protection circuit includes:

obtaining the load current information and target current limiting information in one current limiting state;

adjusting an output current of the seventh current source in different current limiting states based on a proportional relationship between the load current information and the target current limiting information or adjusting a current mirror ratio of the current mirror circuit to calibrate the gain error of the overcurrent protection circuit.

15. The calibration method according to claim 13, wherein the step of calculating and obtaining the offset error based on the load current information and the current information includes:

obtaining a second relationship based on the load current information and the current information in different predetermined current limiting states, and wherein the second relationship represents a variation relationship of the current information with respect to the load current information; and calculating and obtaining the offset error, and wherein the offset error corresponds to the current information when the load current information is zero.

16. The calibration method according to claim 8, wherein:

the gain calibration circuit comprising an eighth current source, and wherein:

a second terminal of the eighth current source is a first terminal of the gain calibration circuit;

a first terminal of the eighth current source is a second terminal and an output terminal of the gain calibration circuit; and the eighth current source outputs a current difference through the first terminal, allowing the driving circuit to adjust a conduction resistance of the first transistor based on the current difference, and wherein the step of obtaining the offset error of the overcurrent protection circuit by changing the current limiting state of the overcurrent protection circuit includes:

obtaining load current information and current information at the first terminal of the eighth current source in at least two different predetermined current limiting states of the overcurrent protection circuit under a compensation effect of the offset compensation circuit; and calculating and obtaining the offset error based on the load current information and the current information.

17. The calibration method according to claim 16, wherein:

the step of adjusting the gain calibration circuit based on the current limiting state of the overcurrent protection circuit to calibrate the gain error of the overcurrent protection circuit includes:

obtaining the load current information and the target current limiting information in one current limiting state; and adjusting an output current of the eighth current source in different current limiting states based on a proportional relationship between the load current information and the target current limiting information to calibrate the gain error of the overcurrent protection circuit.

18. The calibration method according to claim 17, wherein the step of calculating and obtaining the offset error based on the load current information and the current information includes:

obtaining a second relationship based on the load current information and the current information in different predetermined current limiting states, and wherein the second relationship represents a variation relationship of the current information with respect to the load current information; and calculating and obtaining the offset error, and wherein the offset error corresponds to the current information when the load current information is zero.

19. The calibration method according to claim 8, wherein the step of adjusting the offset compensation circuit to calibrate the offset error of the overcurrent protection circuit includes:

adjusting the offset compensation circuit to change a voltage drop across a first compensation resistor and/or a second compensation resistor of the offset compensation circuit until the offset error is less than or equal to a predetermined threshold, thereby completing a calibration process of the offset error of the overcurrent protection circuit.

20. The calibration method according to claim 19, wherein the step of adjusting the offset compensation circuit to change the voltage drop across the first compensation resistor and/or the second compensation resistor includes:

when the offset error is positive, iteratively adjusting the offset compensation circuit to increase a current at a non-inverting input terminal of the first operational amplifier to gradually increase the voltage drop across the first compensation resistor; and when the offset error is negative, iteratively adjusting the offset compensation circuit to increase a current at an inverting input terminal of the first operational amplifier to gradually increase the voltage drop across the second compensation resistor.

\* \* \* \* \*